US 8,269,309 B2

(12) United States Patent
Hotta et al.

(10) Patent No.: US 8,269,309 B2
(45) Date of Patent: *Sep. 18, 2012

(54) SEMICONDUCTOR DEVICE WITH A FUSE FORMED BY A DAMASCENE TECHNIQUE AND A METHOD OF MANUFACTURING THE SAME

(75) Inventors: Katsuhiko Hotta, Tokyo (JP); Kyoko Sasahara, Tokyo (JP); Taichi Hayamizu, Tokyo (JP); Yuichi Kawano, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/071,546

(22) Filed: Mar. 25, 2011

(65) Prior Publication Data

US 2011/0169128 A1 Jul. 14, 2011

Related U.S. Application Data

(60) Continuation of application No. 12/564,043, filed on Sep. 21, 2009, now Pat. No. 7,968,966, which is a continuation of application No. 12/102,532, filed on Apr. 14, 2008, now Pat. No. 7,602,040, which is a division of application No. 11/453,897, filed on Jun. 16, 2006, now Pat. No. 7,419,901.

(30) Foreign Application Priority Data

Jul. 6, 2005 (JP) .................................. 2005-197939

(51) Int. Cl.
*H01L 29/00* (2006.01)
*H01L 23/58* (2006.01)

(52) U.S. Cl. ......... 257/529; 257/637; 257/642; 257/643
(58) Field of Classification Search ................ 257/48, 257/529, 635, 637, 642, 643
See application file for complete search history.

(56) References Cited

U.S. PATENT DOCUMENTS

| 6,111,301 | A | 8/2000 | Stamper |
| 6,440,833 | B1 | 8/2002 | Lee et al. |
| 6,638,795 | B2 | 10/2003 | Ikeda et al. |
| 6,689,681 | B2 | 2/2004 | Watanabe |
| 6,727,590 | B2 | 4/2004 | Izumitani et al. |

(Continued)

FOREIGN PATENT DOCUMENTS

JP 2001-85526 A 3/2001

(Continued)

OTHER PUBLICATIONS

Office Action issued Jun. 7, 2011 in Japanese Patent Application No. 2005-197939.

(Continued)

*Primary Examiner* — Ori Nadav
(74) *Attorney, Agent, or Firm* — Miles & Stockbridge P.C.

(57) ABSTRACT

In order to improve the reliability of a semiconductor device having a fuse formed by a Damascene technique, a barrier insulating film and an inter-layer insulating film are deposited over a fourth-layer wiring and a fuse. The barrier insulating film is an insulating film for preventing the diffusion of Cu and composed of a SiCN film deposited by plasma CVD like the underlying barrier insulating film. The thickness of the barrier insulating film covering the fuse is larger than the thickness of the underlying barrier insulating film so as to improve the moisture resistance of the fuse.

4 Claims, 29 Drawing Sheets

U.S. PATENT DOCUMENTS

| | | |
|---|---|---|
| 6,812,127 B2 | 11/2004 | Oshima et al. |
| 7,018,917 B2 | 3/2006 | Elers |
| 7,067,897 B2 | 6/2006 | Hatano et al. |
| 7,301,241 B2 | 11/2007 | Watanabe |
| 7,323,760 B2 | 1/2008 | Sakoh |
| 7,602,040 B2 | 10/2009 | Hotta et al. |
| 2001/0038147 A1 | 11/2001 | Higashi et al. |
| 2003/0155590 A1 | 8/2003 | Hatano et al. |
| 2003/0183940 A1 | 10/2003 | Noguchi et al. |
| 2003/0227089 A1 | 12/2003 | Watanabe et al. |
| 2004/0152334 A1 | 8/2004 | Ohto et al. |
| 2005/0032355 A1 | 2/2005 | Yeh et al. |

FOREIGN PATENT DOCUMENTS

| | | |
|---|---|---|
| JP | 2001-274247 A | 10/2001 |
| JP | 2003-17570 A | 1/2003 |
| JP | 2003-124307 A | 4/2003 |
| JP | 2003-318262 A | 11/2003 |
| JP | 2004-221275 A | 8/2004 |

OTHER PUBLICATIONS

Office Action issued Aug. 23, 2011 in Japanese Patent Application No. 2005-197939.

SEMICONDUCTOR DEVICE WITH A FUSE FORMED BY A DAMASCENE TECHNIQUE AND A METHOD OF MANUFACTURING THE SAME

CROSS-REFERENCE TO RELATED APPLICATION

This application is a continuation of application Ser. No. 12/564,043 filed Sep. 21, 2009, now U.S. Pat. No. 7,968,966 which is a continuation of application Ser. No. 12/102,532 filed Apr. 14, 2008 (now U.S. Pat. No. 7,602,040), which is a division of application Ser. No. 11/453,897 filed Jun. 16, 2006 (now U.S. Pat. No. 7,419,901). The present application also claims priority from Japanese patent application No. 2005-197939 filed Jul. 6, 2005, the content of which is hereby incorporated by reference into this application.

BACKGROUND OF THE INVENTION

The present invention relates to a semiconductor device and a method of manufacturing the same and, specifically, to an effective technology applied to a semiconductor device having a fuse formed by a Damascene technique.

In the method of manufacturing a fine semiconductor device, a fine wiring forming method called "Damascene technique" is becoming popular.

In the Damascene technique, after a fine wiring groove is formed in an inter-layer insulating film over a semiconductor substrate, a metal film is deposited on the inter-layer insulating film including the inside of the wiring groove, and the metal film outside the wiring groove is removed by chemical mechanical polishing to form a fine buried wiring in the groove.

In a dual-Damascene technique in particular, a via hole for connecting the wirings of lower layers is formed in the lower portion of a wiring groove formed in an inter-layer insulating film, and a metal film is buried in the wiring groove and the via hole at the same time to form a wiring, thereby reducing the number of steps. Meanwhile, a technique for forming a buried wiring in the inside of a wiring groove after a metal plug is formed in the via hole is called "single-Damascene technique".

As the metal material of the buried wiring, Cu (copper which can ensure high reliability even when it is made thin is mainly used. When a buried wiring is formed in an inter-layer insulating film by the Damascene technique, to reduce capacitance which is generated between adjacent wirings, the inter-layer insulating film is made of an insulating material having a low dielectric constant. Technology for forming a buried wiring in an inter-layer insulating film made of a low-dielectric constant material by the Damascene technique is disclosed by Japanese Unexamined Patent Publication No 2004-221275 (patent document 1) and Japanese Unexamined Patent Publication No. 2003-124307 (patent document 2).

Japanese Unexamined Patent Publication No. 2003-318262 (patent document 3) discloses a structure that the copper wiring of the uppermost layer is used as a fuse and an SiCN film is formed on the surface of the copper wiring of the uppermost layer.

[patent document 1] Japanese Unexamined Patent Publication No. 2004-221275

[patent document 2] Japanese Unexamined Patent Publication No. 2003-124307

[patent document 3] Japanese Unexamined Patent Publication No. 2003-318262

SUMMARY OF THE INVENTION

Semiconductor memories such as SRAM (Static Random Access memory) and DRAM (Dynamic Random Access Memory) have a redundancy function for remedying a defect produced in the wafer manufacturing process to improve their production yields.

This is a defect remedy function for preventing a whole chip from becoming defective even if a failure occurs in part of a circuit by preparing spare columns and rows (redundant circuits) in part of the circuit and selecting spare columns and rows when an address signal is supplied to a defective cell (failure bit) in a memory array of memory cells.

Switching from a failure part to a spare part is carried out by cutting a defect remedy fuse connected to an address switch circuit. To cut this fuse, a laser welding system having a high degree of freedom of a substitution program and advantageous from the viewpoint of area efficiency is mainly employed.

The defect remedy fuse is made of a metal wiring material and formed at the same time in the step of forming a wiring over the semiconductor substrate. When a defective cell is found by a probe test in the final step of the wafer manufacturing process, the above fuse is cut by a laser to allocate an address to a redundant cell corresponding to the defective cell. Therefore, when a copper buried wiring is formed in the inter-layer insulating film by the above Damascene technique, the copper fuse is formed at the same time in the step of forming the buried wiring.

When the fuse is to be cut by the above laser welding system, to facilitate cutting the fuse, prior to the probe test, an opening must be formed in the insulating film above the fuse and the insulating film covering the fuse must be made thinner than other areas. However, as this opening remains as it is even when the wafer manufacturing process ends and the wafer is divided into chips, even if water enters the inside of a chip from the outside through the thin insulating film, it corrodes the fuse. When the fuse corrodes, corrosion spreads into the chip through the wiring connected to the fuse, thereby reducing the service life and reliability of a semiconductor device. Although there are some memory products produced by coating a polyimide resin on the surface of a wafer after the probe test, as the polyimide resin film has low moisture resistance, it cannot prevent the entry of water into a chip effectively.

It is an object of the present invention to provide a technology for improving the reliability of a semiconductor device having a fuse formed by the Damascene technique.

The above and other objects and new features of the present invention will become apparent from the following description when in conjunction with the accompanying drawings.

A brief description of a typical invention out of the inventions disclosed by the present application is given below.

The semiconductor device of the present invention comprises a first inter-layer insulating film formed on the main surface of a semiconductor substrate, first wirings buried in the insides of first wiring grooves formed in the first inter-layer insulating film, a second inter-layer insulating film formed over the first inter-layer insulating film through a first barrier insulating film for covering the first wirings, a fuse buried in the inside of a second wiring groove formed in the second inter-layer insulating film, a second wiring buried in the inside of a third wiring groove formed in the second inter-layer insulating film, a second barrier insulating film covering the fuse and the second wiring, an uppermost layer wiring formed over the second barrier insulating film through a first insulating film, and a surface protective film covering the uppermost layer wiring, wherein:

the second barrier insulating film is thicker than the first barrier insulating film; and a first opening reaching the surface of the second barrier insulating film is formed in the first insulating film and the surface protective film above the fuse.

The method of manufacturing a semiconductor device according to the present invention comprises the steps of:

(a) forming a first inter-layer insulating film on the main surface of a semiconductor substrate and first wiring grooves in the first inter-layer insulating film;
(b) forming a first metal film over the first inter-layer insulating film including the insides of the first wiring grooves and removing the first metal film outside the first wiring grooves by chemical mechanical polishing to form first wirings composed of the first metal film in the insides of the first wiring grooves;
(c) forming a first barrier-insulating film over the first inter-layer insulating film including the top portions of the first wirings;
(d) forming a second inter-layer insulating film over the first barrier insulating film and second and third wiring grooves in the second inter-layer insulating film;
(e) forming a second metal film over the second inter-layer insulating film including the insides of the second and third wiring grooves, and removing the second metal film outside the second and third wiring grooves by chemical mechanical polishing to form a fuse composed of the second metal film in the inside of the second wiring groove and a second wiring composed of the second metal film in the inside of the third wiring groove;
(f) forming a second barrier insulating film thicker than the first barrier insulating film over the second inter-layer insulating film including the top portions of the second wiring and the fuse;
(g) forming a first insulating film over the second barrier insulating film and an uppermost layer wiring over the first insulating film; and
(h) forming a first opening reaching the surface of the second barrier insulating film in the first insulating film and the surface protective film above the fuse and a second opening reaching the uppermost layer wiring in the first insulating film and the surface protective film above the uppermost layer wiring.

An effect obtained by the typical invention out of the inventions disclosed by the present application will be briefly described hereinbelow.

The reliability of a fuse element can be improved. That is, the reliability of a semiconductor device can be improved. Further, the method of manufacturing a semiconductor device can be simplified.

DETAILED DESCRIPTION OF THE PREFERRED EMBODIMENTS

Preferred embodiments of the present invention will be described in detail hereinunder with reference to the accompanying drawings. In all the figures for explaining the embodiments, the same members are given the same reference symbols in principle and their repeated description are omitted.

(Embodiment 1)

This embodiment is a semiconductor device having four-layer Cu wirings and a fuse. Its manufacturing method will be described in the order of steps with reference to FIGS. 1 to 26.

Figure 1:
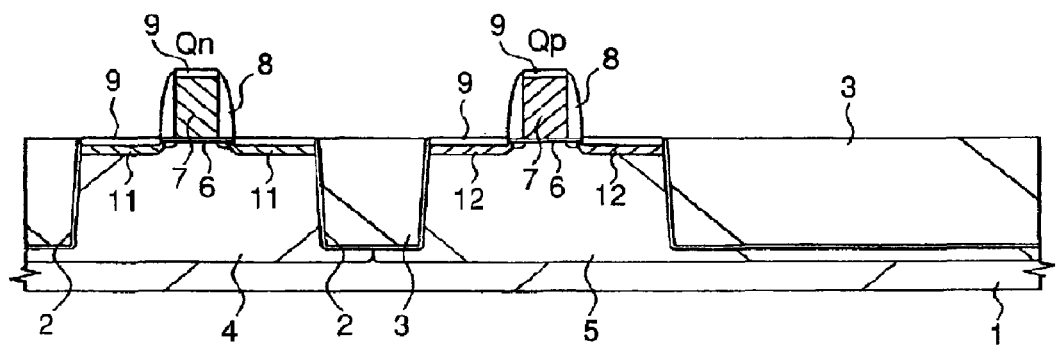
FIG. 1 is a sectional view of the key section of a semiconductor substrate showing a method of manufacturing a semiconductor device according to an embodiment of the present invention.

As shown in FIG. 1, an n channel type MISFET (Qn) and a p channel type MISFET (Qp) are first formed as semiconductor devices on the main surface of a semiconductor substrate (to be simply referred to as "substrate" hereinafter) 1 made of monocrystal silicon. Reference numeral 2 in FIG. 1 denotes a device separation groove, 4 a p type well and 5 an n type well.

The device separation groove 2 is formed by burying, for example, a silicon oxide film 3 as an insulating film in the inside of a groove formed by etching the substrate 1. The p type well 4 and the n type well 5 are formed by injecting a p type impurity (boron) ion and an n type impurity (phosphorus) ion into the substrate 1 and heating the substrate 1 to diffuse these impurities into the substrate 1.

The n channel type MISFET (Qn) comprises a gate insulating film 6 composed of a silicon oxide film or silicon oxynitride nitride film formed on the surface of the p type well 4, a gate electrode 7 composed of a polycrystal silicon film formed over the gate insulating film 6, a side wall spacer 8 composed of a silicon oxide film formed on the side walls of the gate electrode 7, and a pair of n type semiconductor regions (source, drain) 11 formed over the p type well 4 on both sides of the gate electrode 7. The p channel type MISFET (Qp) comprises a gate insulating film 6, a gate electrode 7, a side, wall spacer 8, and a pair of p type semiconductor regions (source, drain) 12 formed over the n type well 5 on both sides of the gate electrode 7. An n type impurity (phosphorus) is introduced into the polycrystal silicon film constituting the gate electrode 7 of the n channel type MISFET (Qn), and a p type impurity (boron) is introduced into the polycrystal silicon film constituting the gate electrode 7 of the p channel type MISFET (Qp). A Co (cobalt) silicide film 9 is formed on the surfaces of the gate electrode 7 and the n type semiconductor regions (source, drain) 11 of the n channel type MISFET (Qn) and the surfaces of the gate electrode 7 and the p type semiconductor regions (source, drain) 12 of the p channel type MISFET (Qp) in order to reduce the resistances of the gate electrodes 7 and the sources and drains.

Figure 2:
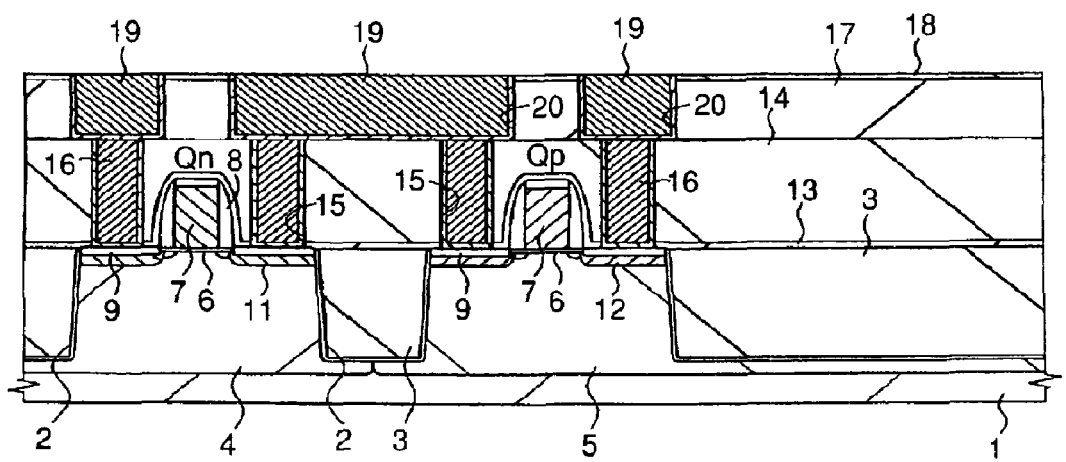
FIG. 2 is a sectional view of the key section of the semiconductor substrate showing the method of manufacturing a semiconductor device after FIG. 1.

Thereafter, as shown in FIG. 2, plugs 16 and first-layer wirings 19 are formed over the n channel type MISFET (Qn) and the p channel type MISFET (Qp) to electrically connect the n channel type MISFET (Qn) and the p channel type MISFET (Qp) to the first-layer wirings 19 by the plugs 16.

The first-layer wirings 19 are formed by the following method. After an etching stopper film 13 and an insulating film 14 are deposited over the substrate 1, the surface of the insulating film 14 is flattened by chemical mechanical polishing. The etching stopper film 13 is composed of a silicon nitride film deposited by CVD, for example, and the insulating film 14 is composed of a silicon oxide film deposited by CVD, for example.

Then, the insulating film 14 over the n type semiconductor regions (source, drain) 11 of the n channel type MISFET (Qn) and the p type semiconductor regions (source, drain) 12 of the p channel type MISFET (Qp) is etched, and the etching stopper film 13 underlying the insulating film 14 is etched to form contact holes 15. The plugs 16 are then formed in the contact hole 15. The plugs 16 are composed of a laminate film consisting of a TiN (titanium nitride) film and a W (tungsten) film, for example. The TiN film serves as a barrier metal film for the W film. The barrier metal film may be composed of a laminate film consisting of a TiN film and a Ti (titanium) film.

An insulating film 17 (SiOC film 17) having a thickness of about 200 nm and an insulating film 18 which is a silicon oxide film having a thickness of about 50 nm are then deposited over the insulating film 14 by CVD and dry etched by using a photoresist film (not shown) as a mask to form wiring grooves 20. The insulating film 17 (SiOC film 17) is a low-dielectric insulating film for reducing capacitance between wirings, as exemplified by an insulating film having a lower dielectric constant than the dielectric constant of a silicon oxide film (such as a TEOS (tetraethoxysilane) oxide film). In general, an insulating film having a lower dielectric constant than the dielectric constant ($\blacksquare$=4.1 to 4.2) of a TEOS oxide film is called "low-dielectric insulating film". In this embodiment, the dielectric constant is about 2.7. The insulating film 18 formed over the SiOC film 17 serves as a protective film for preventing the SiOC film 17 having low mechanical strength from being deteriorated by chemical mechanical polishing.

Then, a barrier metal film having a thickness of about 50 nm and composed of a TiN film or a laminate film consisting of a TiN film and a Ti film is deposited in the insides of the wiring grooves 20 by sputtering and a Cu film thick (about 800 to 1,600 nm) enough to fill the insides of the wiring grooves 20 completely is deposited by sputtering or plating. The barrier metal film serves as a barrier film for preventing the Cu film from diffusing into the insulating film therearound. As the barrier metal film may be used a metal nitride film such as a WN (tungsten nitride) film or TaN (tantalum nitride) film, a film made of an alloy obtained by adding Si to one of these materials, a high-melting point metal film such as Ta film, Ti film, W film or TiW film, a laminate film consisting of these high-melting point metal films, or a conductive film which is hardly reactive with Cu, besides the TiN film.

Thereafter, a metal film essentially composed of copper is formed in the insides of the wiring grooves 20 by removing the Cu film and the barrier metal film outside the wiring grooves 20 by chemical mechanical polishing. The first-layer wirings 19 composed of a laminate film consisting of the barrier metal film and the Cu film remaining in the insides of the wiring grooves 20 are thus formed.

Figure 3:
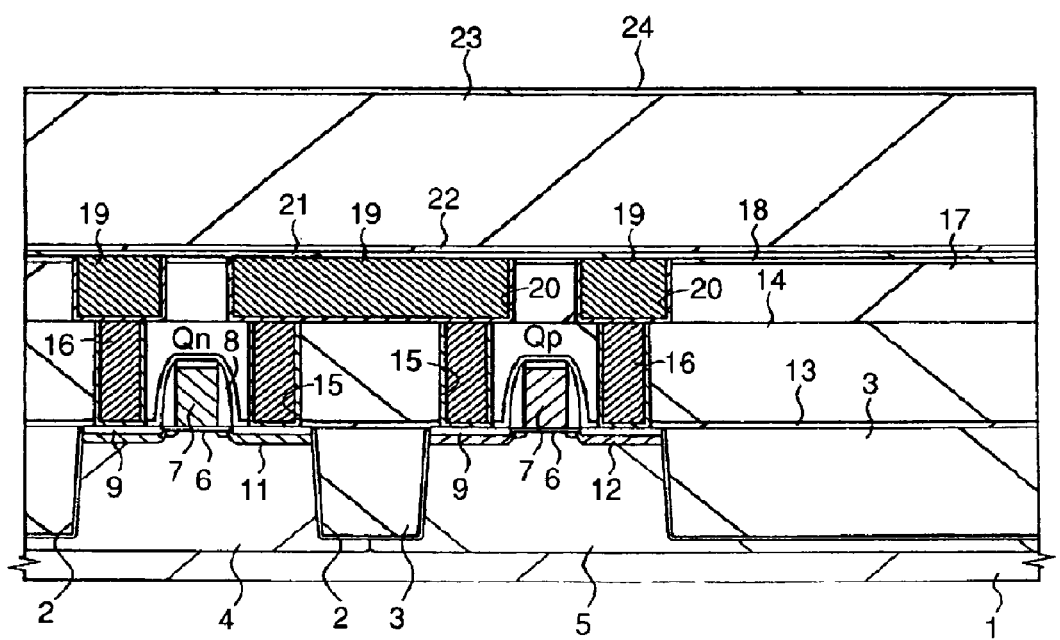
FIG. 3 is a sectional view of the key section of the semiconductor substrate showing the method of manufacturing a semiconductor device after FIG. 2.

Thereafter, as shown in FIG. 3, barrier insulating films 21 and 22, an inter-layer insulating film 23 and an insulating film 24 are deposited over the first-layer wirings 19 sequentially. The barrier insulating film 21 is an insulating film for preventing Cu as the material of the first-layer wirings 19 from diffusing into the inter-layer insulating film 23 and composed of, for example, a SiCN film having a thickness of 20 to 100 nm deposited by plasma CVD. The barrier insulating film 22 is an insulating film for preventing an amine compound contained in the SiCN film constituting the underlying barrier insulating film 21 from diffusing into the inter-layer insulating film 23 and composed of, for example, a SiCO film having a thickness of about 10 to 100 nm deposited by CVD. When the amine compound is diffused into the inter-layer insulating film 23, it diffuses into a photoresist film which is formed over the insulating film 24 in the subsequent step, thereby deactivating the photosensitive function of the photoresist film.

The inter-layer insulating film 23 is composed of an insulating film having a low dielectric constant, for example, the above SiOC film to reduce capacitance between the first-layer wirings 19 and second-layer wirings which are formed in a later step. The SiOC film is deposited by CVD and has a thickness of about 460 nm. The low-dielectric film such as the inter-layer insulating film 23 can be formed by coating. The insulating film 24 formed over the inter-layer insulating film 23 is also an insulating film for protecting the inter-layer insulating film 23 composed of a SiOC film having low mechanical strength when Cu wirings are formed by chemical mechanical polishing like the underlying insulating film 18 and composed of a silicon oxide film having a thickness of about 50 nm deposited by CVD.

Figure 4:
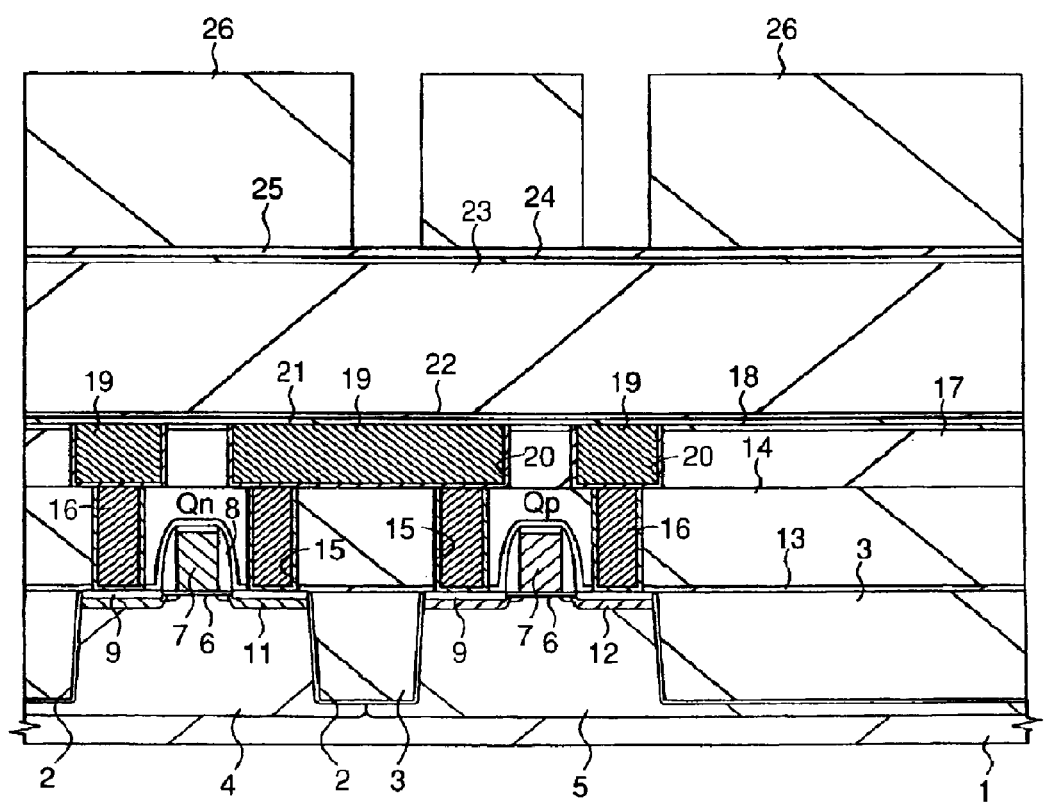
FIG. 4 is a sectional view of the key section of the semiconductor substrate showing the method of manufacturing a semiconductor device after FIG. 3.

Subsequently, as shown in FIG. 4, an anti-reflection film 25 is formed over the insulating film 24, and a photoresist film 26 is formed over the anti-reflection film 25. The anti-reflection film 25 is formed to prevent a reduction in resolution caused by the incidence upon the photoresist film 26 of exposure light reflected on the surface of the first-layer wirings 19 when the photoresist film 26 is exposed. The anti-reflection film is called "BARC (Bottom Anti Reflective Coating)" and has a higher refractive index than those of the underlying insulating film 24 and inter-layer insulating film 23. The photoresist film 26 is exposed through a photomask (not shown) having a via hole pattern and developed to transfer a pattern having openings for forming via holes.

Figure 5:
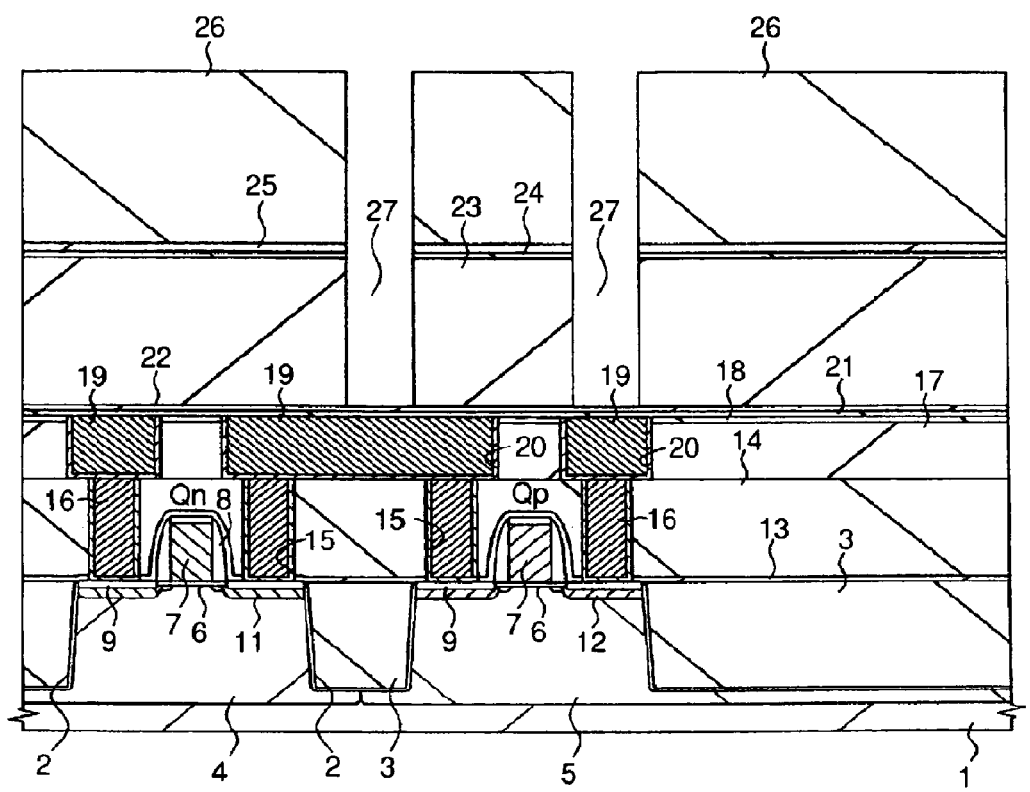
FIG. 5 is a sectional view of the key section of the semiconductor substrate showing the method of manufacturing a semiconductor device after FIG. 4.

As shown in FIG. 5, the anti-reflection film 25, the insulating film 24 and the inter-layer insulating film 23 are then dry etched by using the photoresist film 26 as a mask sequentially to form via holes 27 above the first-layer wirings 19.

Figure 6:
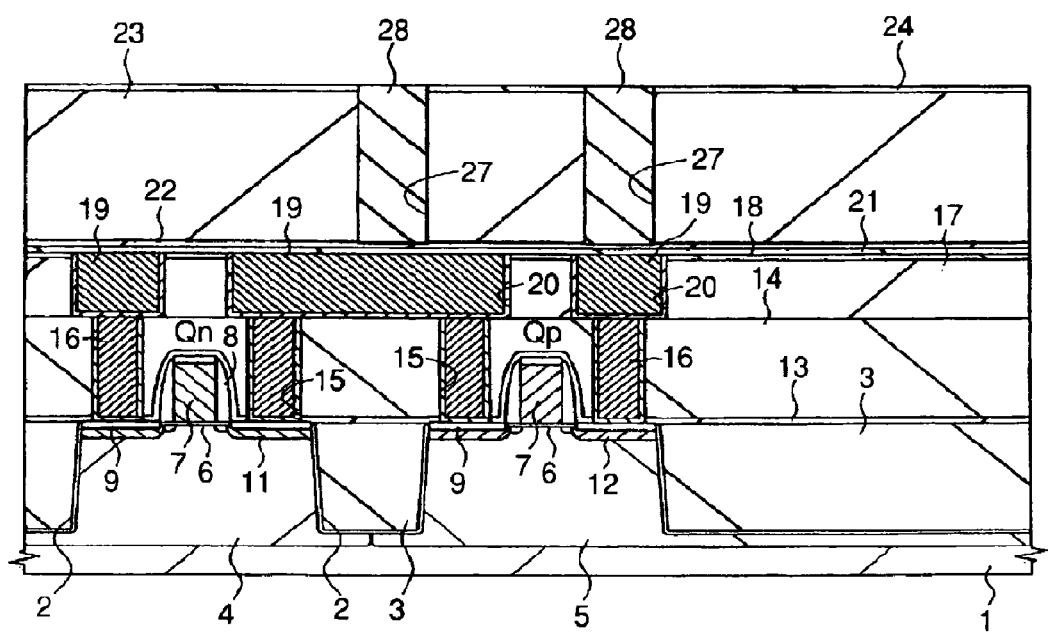
FIG. 6 is a sectional view of the key section of the semiconductor substrate showing the method of manufacturing a semiconductor device after FIG. 5.

Thereafter, the photoresist film 26 and the anti-reflection film 25 are removed. At this point, when the anti-reflection film 25 is composed of the above BARC, as the composition of the film is similar to that of the photoresist film 26, the photoresist film 26 and the anti-reflection film 25 can be removed at the same time by one time of cleaning. Thereafter, as shown in FIG. 6, a filling agent 28 is filled into the via holes 27. The filling agent 28 is an insulating material which is almost the same as the anti-reflection film 25 in composition. To fill the filling agent 28, after the filling agent 28 is applied to the insulating film 24 including the insides of the via holes 27 and cured, the filling agent 28 outside the via holes 27 is etched back. The diameter of the via holes 27 for connecting the first-layer wirings 19 to the second-layer wirings which are formed later is relatively small. Therefore, when this etch-back is carried out, the surface of the filing agent 28 filled into the via holes 27 becomes almost flat and almost flush with the surface of the insulating film 24.

Figure 7:
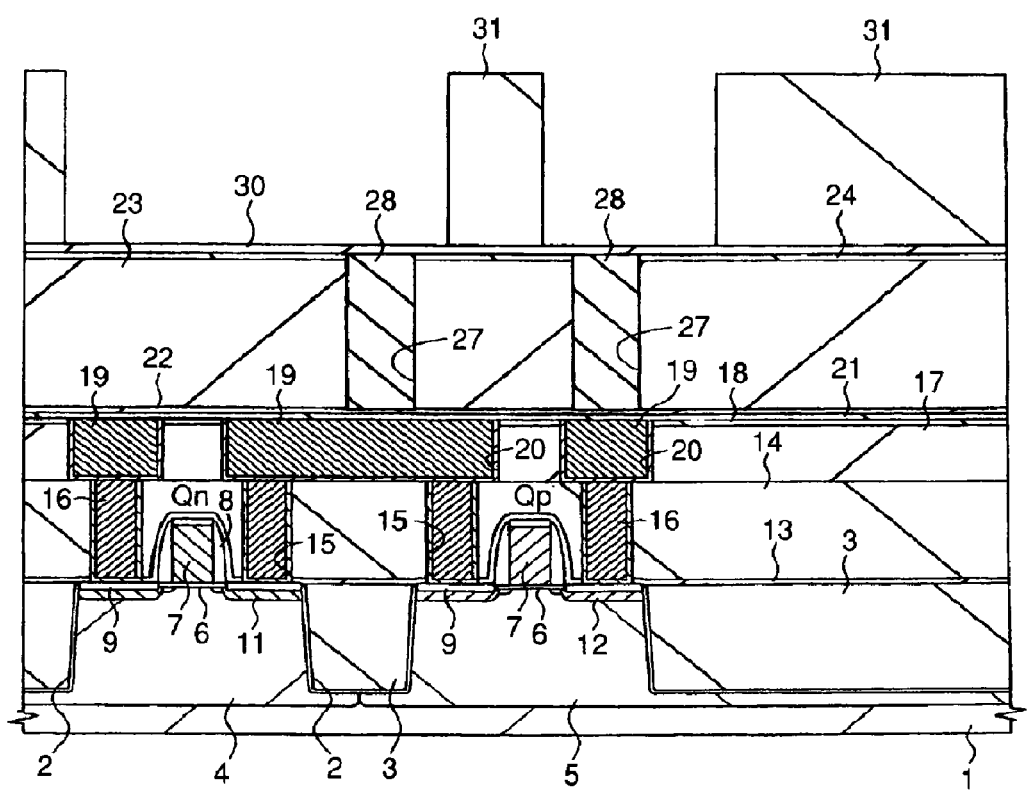
FIG. 7 is a sectional view of the key section of the semiconductor substrate showing the method of manufacturing a semiconductor device after FIG. 6.

Then, as shown in FIG. 7, an anti-reflection film 30 is formed over the insulating film 24, and a photoresist film 31 is formed over the anti-reflection film 30. In this embodiment, the anti-reflection film 30 is composed of the above BARC. A pattern having openings for wiring groove forming areas is transferred by exposing the photoresist film 31 to light through a photomask (not shown) having a wiring groove pattern and developing it.

Figure 8:
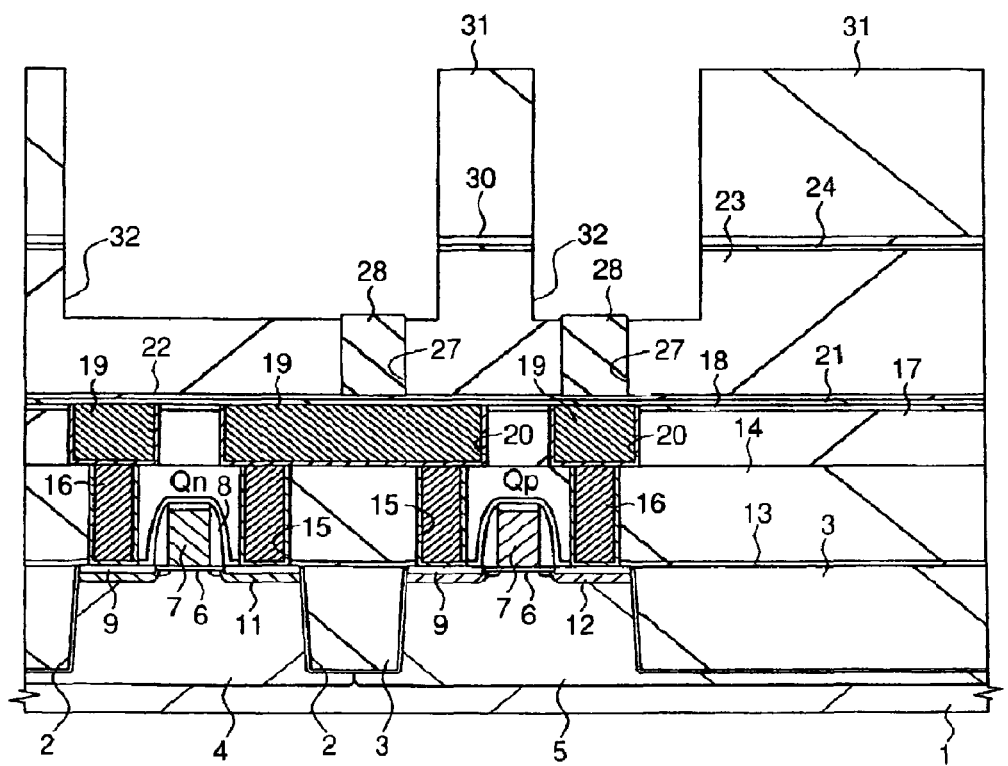
FIG. 8 is a sectional view of the key section of the semiconductor substrate showing the method of manufacturing a semiconductor device after FIG. 7.

Thereafter, as shown in FIG. 8, the anti-reflection film 30 and the insulating film 24 are dry etched by using the photoresist film 31 as a mask, and the inter-layer insulating film 23 is dry etched halfway so as to form wiring grooves 32. Since there is no etching stopper film in the inter-layer insulating film 23 at this point, etching for forming the wiring grooves 32 is carried out by time control. As will be described hereinafter, since the size of the wirings of a lower layer is laid out more finely than the size of the wirings of an upper layer, when a film having a higher dielectric constant than that of the inter-layer insulating film 23 is formed, capacitance between wirings increases. In this embodiment, the capacitance between wirings can be reduced by forming no etching stopper film in the inter-layer insulating film 23. Since the depth of the wiring grooves of an upper layer is laid out smaller than the depth of the wiring grooves of a lower layer, the amount of etching for forming the wiring grooves is small, thereby making it possible to control the film thickness by controlling the etching time without forming an etching stopper film.

Figure 9:
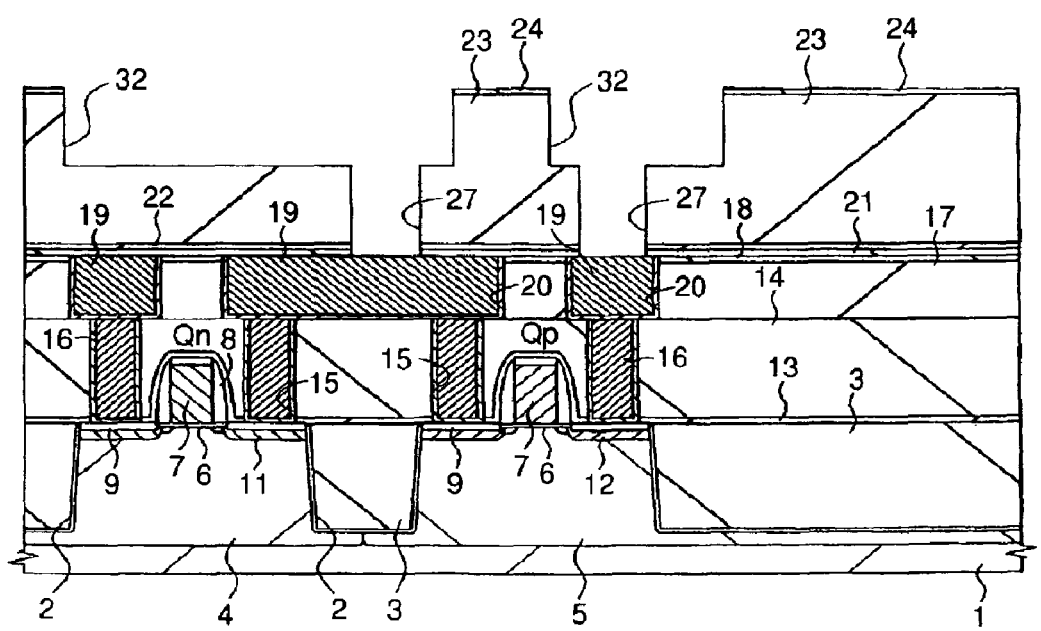
FIG. 9 is a sectional view of the key section of the semiconductor substrate showing the method of manufacturing a semiconductor device after FIG. 8.

After the photoresist film 31 is removed, as shown in FIG. 9, the anti-reflection film 30 over the insulating film 24 is removed by dry etching. The filling agent 28 filled in the via holes 27 and the barrier insulating films 22 and 21 underlying the filling agent 28 are also etched to expose the surfaces of the first-layer wirings 19 to the bottoms of the via holes 27.

Figure 10:
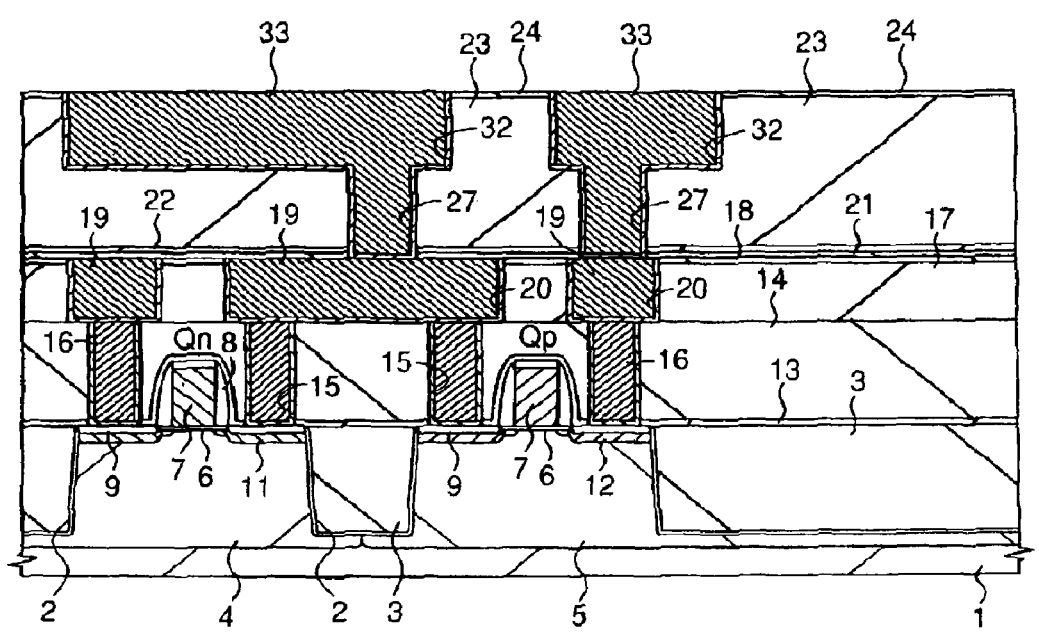
FIG. 10 is a sectional view of the key section of the semiconductor substrate showing the method of manufacturing a semiconductor device after FIG. 9.

Then, as shown in FIG. 10, second-layer wirings 33 are formed in the insides of the wiring grooves 32 and the vie holes 27. To form the second-layer wirings 33, a TiN film (barrier metal film) as thin as about 50 nm is deposited over the insulating film 24 including the insides of the wiring grooves 32 and the via holes 27 by sputtering. After a thick Cu film which completely fills the insides of the wiring grooves 32 and the vie holes 27 is deposited over this TiN film by sputtering or plating, the Cu film and the barrier metal film outside the wiring grooves 32 are removed by chemical mechanical polishing. Since the insulating film 24 has higher mechanical strength than the inter-layer insulating film 23, it serves as a protective film for the inter-layer insulating film 23.

Figure 11:
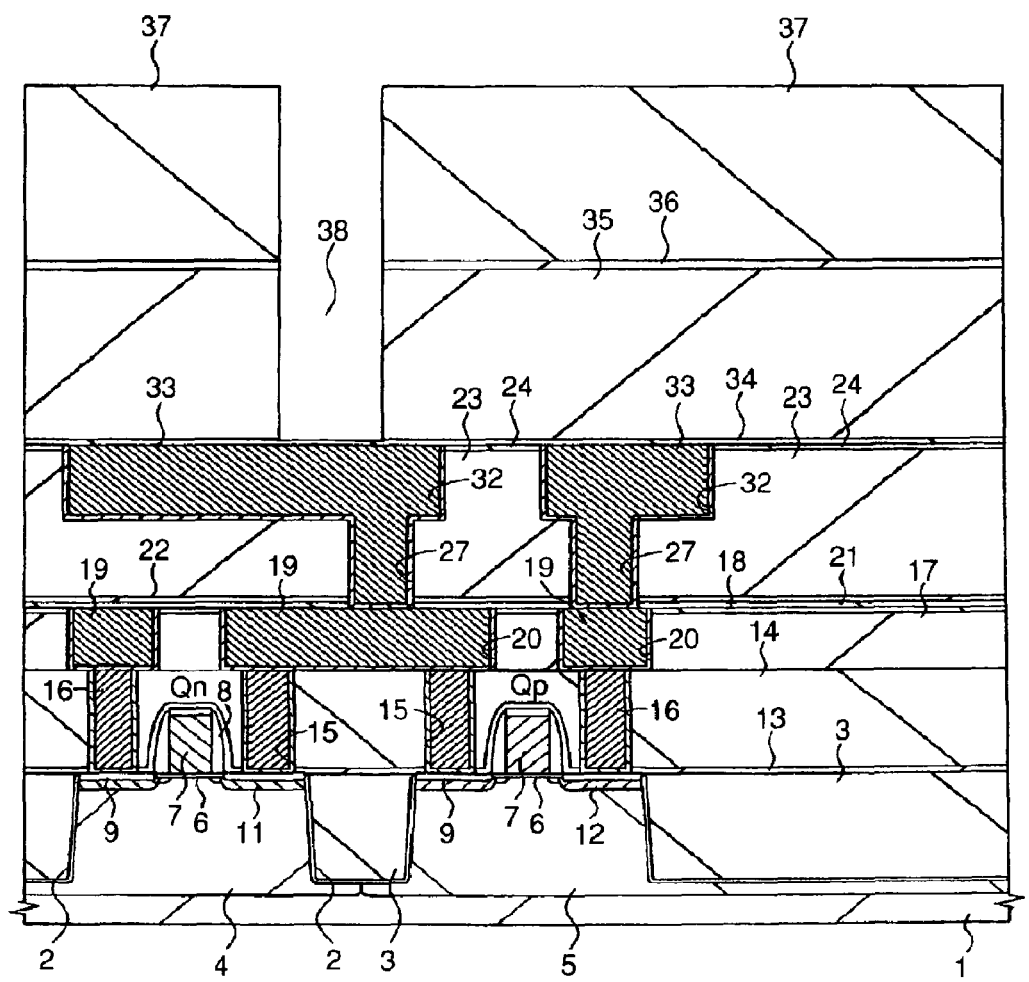
FIG. 11 is a sectional view of the key section of the semiconductor substrate showing the method of manufacturing a semiconductor device after FIG. 10.

After a barrier insulating film 34, an inter-layer insulating film 35 and an anti-reflection film 36 are deposited over the second-layer wirings 33 as shown in FIG. 11, the anti-reflection film 36 and the inter-layer insulating film 35 are dry etched by using the photoresist film 37 formed over the anti-reflection film 36 as a mask to form a via hole 38 above the second-layer wiring 33.

The barrier insulating film 34 is an insulating film for preventing Cu as a wiring material from diffusing into the inter-layer insulating film 35 like the barrier insulating film 21 for covering the surfaces of the first-layer wirings 19 and composed of a SiCN film having a thickness of about 20 to 100 nm deposited by plasma CVD, for example.

Since the distance between wirings becomes larger as the wirings are existent in an upper layer out of multi-layer wirings formed over the substrate 1, capacitance between the wirings becomes smaller. Therefore, the inter-layer insulating film 35 is formed of a silicon oxide film having a thickness of about 700 nm deposited by CVD when capacitance between third-layer wirings which are formed in the subsequent step or capacitance between the third-layer wirings and the second-layer wirings 33 does not become a problem. Since the silicon oxide film is more fine than the SiCO film made of a low-dielectric constant material, when the inter-layer insulating film 35 is composed of a silicon oxide film, even if the inter-layer insulating film 35 is directly deposited on the barrier insulating film 34 which is an SiCN film, the diffusion of an amine compound does not cause a problem. As the SiCN film has relatively low adhesion to a silicon oxide film, a SiCO film may be formed between the barrier insulating film 34 and the inter-layer insulating film 35 to improve adhesion between them. As a silicon oxide-based material for forming the inter-layer insulating film 35, silicon oxide whose dielectric constant is reduced by adding F (fluorine) may be used.

Meanwhile, when capacitance between the third-layer wirings (43) or capacitance between the third-layer wirings (43) and the second-layer wirings 33 becomes a problem, the inter-layer insulating film 35 is made of a low-dielectric constant material such as SiCO. In this case, a SiCO film is formed between the barrier insulating film 34 and the inter-layer insulating film 35 to prevent the diffusion of an amine compound contained in the barrier insulating film 34. A case where the inter-layer insulating film 35 is composed of a silicon oxide film will be described hereinbelow.

Figure 12:
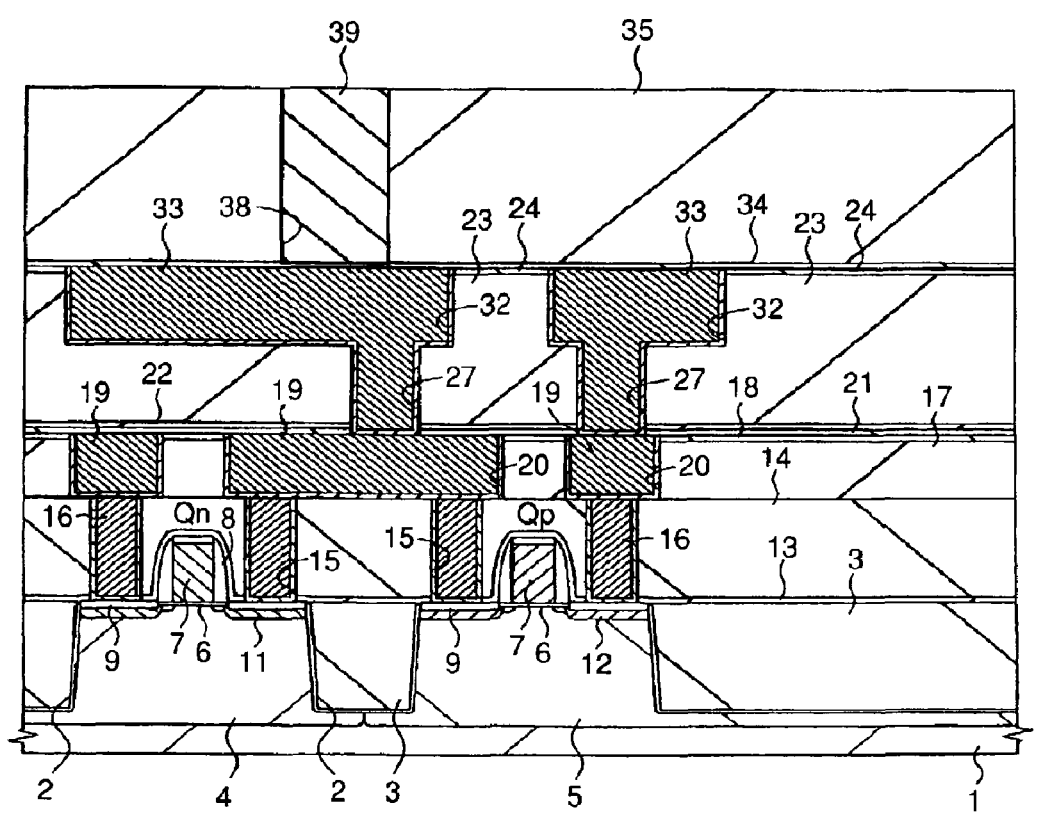
FIG. 12 is a sectional view of the key section of the semiconductor substrate showing the method of manufacturing a semiconductor device after FIG. 11.

After the photoresist film 37 and the anti-reflection film 36 are removed, as shown in FIG. 12, the filling agent 39 is filled into the via hole 38. The filling agent 39 is composed of an insulating material which is almost the same as the above anti-reflection film in composition as described above. The method of filling the filling agent 39 is the same as the method of filling the filing agent 28 into the insides of the via holes 27. Since the diameter of the via hole 38 for connecting the second-layer wirings 33 to the third-layer wirings which are formed later is relatively small, the surface of the filling agent 39 filled into the via hole 38 becomes almost flat and almost flush with the surface of the inter-layer insulating film 35.

Figure 13:
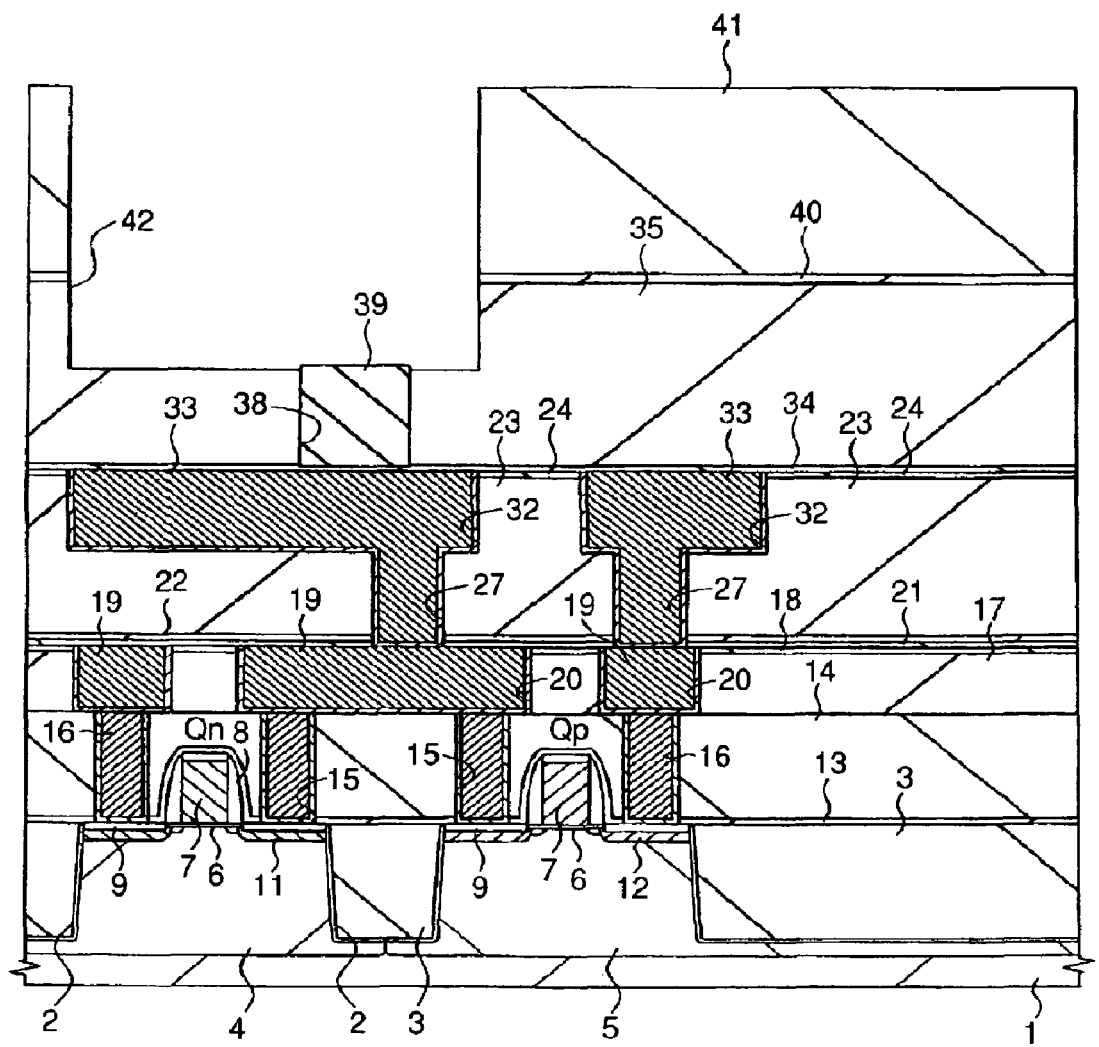
FIG. 13 is a sectional view of the key section of the semiconductor substrate showing the method of manufacturing a semiconductor device after FIG. 12.

Then, as shown in FIG. 13, a wiring groove 42 is formed in the inter-layer insulating film 35. To form the wiring groove 42, after an anti-reflection film 40 is formed over the inter-layer insulating film 35 and a photoresist film 41 is formed over the anti-reflection film 40, the anti-reflection film 40 is dry etched by using the photoresist film 41 as a mask, and the inter-layer insulating film 35 is dry etched halfway. In this embodiment, the formation of the wiring groove 42 is carried out by time-controlled etching like the above wiring grooves 32.

Figure 14:
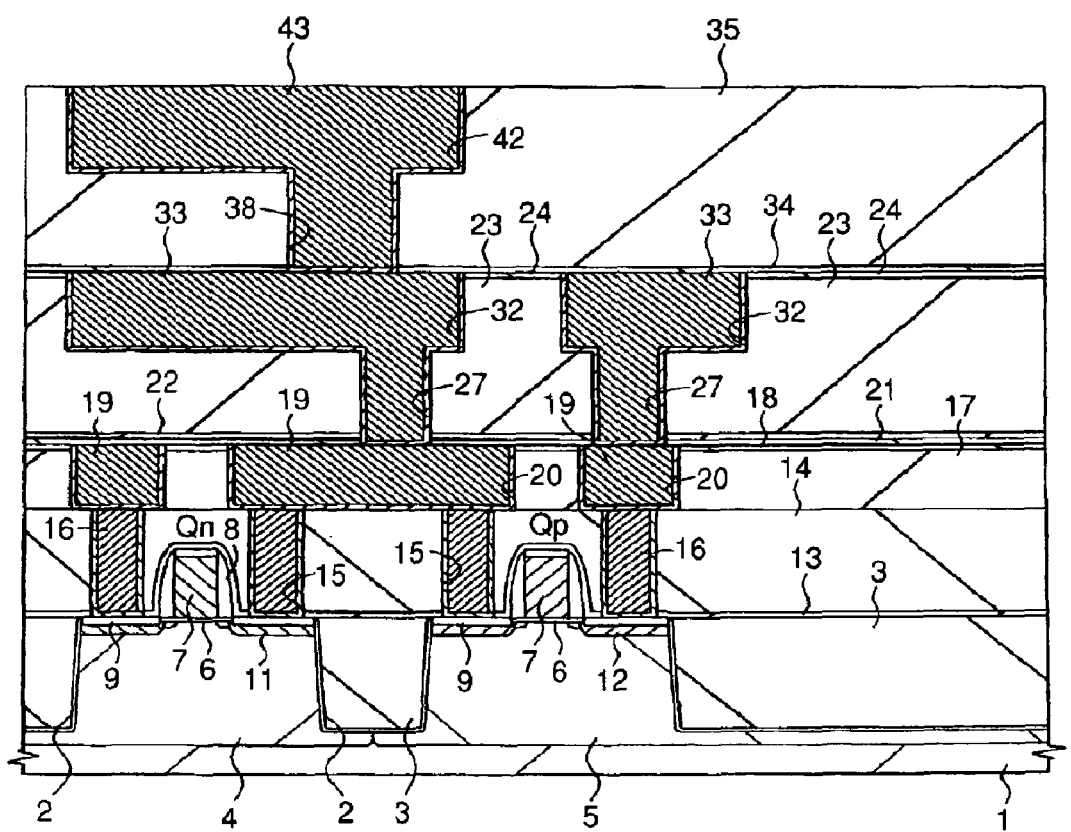
FIG. 14 is a sectional view of the key section of the semiconductor substrate showing the method of manufacturing a semiconductor device after FIG. 13.

As shown in FIG. 14, the third-layer wiring 43 is then formed in the insides of the wiring groove 42 and the via hole 38. To form the third-layer wiring 43, the photoresist film 41 is first removed and then the anti-reflection film 40 is removed by dry etching. When the anti-reflection film 40 is removed, the filling agent 39 filled in the via hole 38 and the barrier insulating film 34 underlying the filling agent 38 are also removed to expose the surface of the second-layer wiring 33 to the bottom of the via hole 38. A thin TiN film (barrier metal film) is deposited over the inter-layer insulating film 35 including the insides of the wiring groove 42 and the via hole 38 by sputtering, a thick Cu film is deposited over this TiN film by sputtering or plating, and the Cu film and the barrier metal film outside the wiring groove 42 are removed by chemical mechanical polishing.

Figure 15:
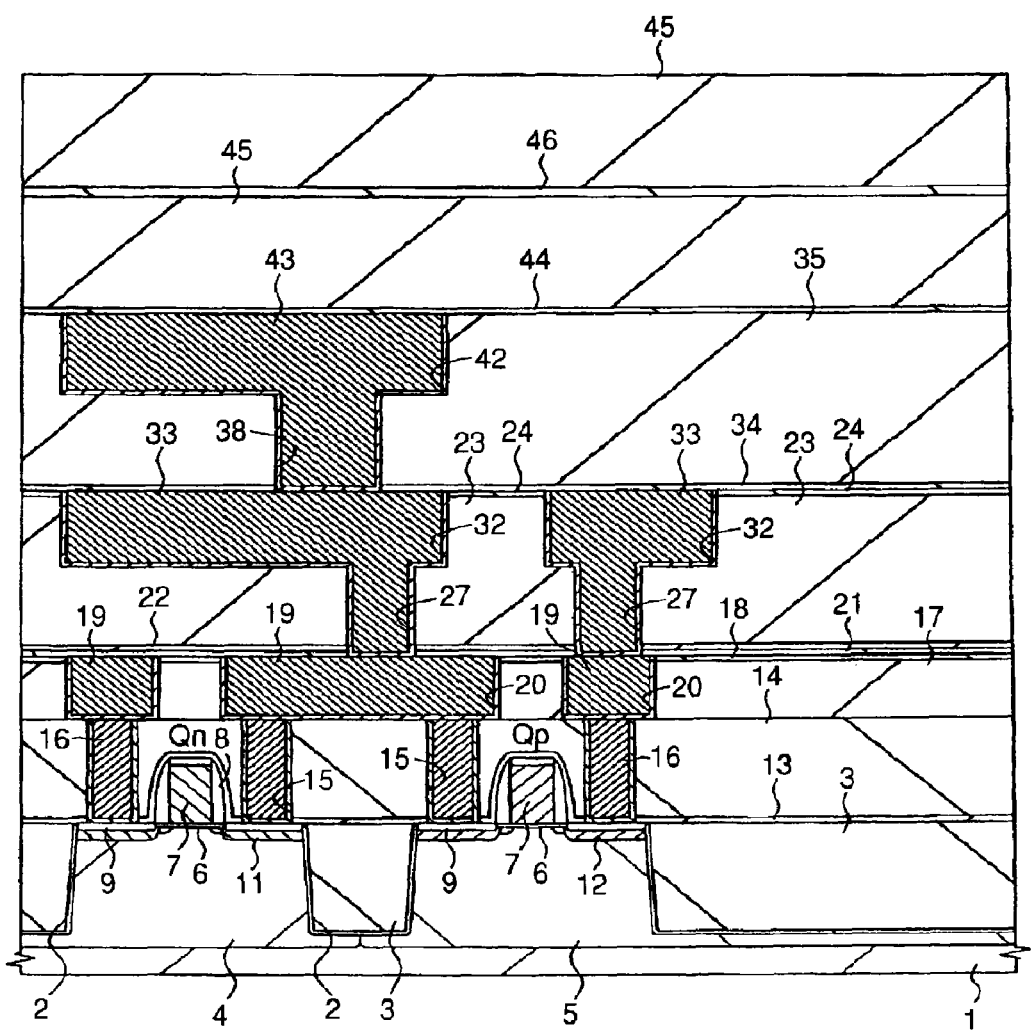
FIG. 15 is a sectional view of the key section of the semiconductor substrate showing the method of manufacturing a semiconductor device after FIG. 14.

Then, as shown in FIG. 15, a barrier insulating film 44 and an inter-layer insulating film 45 are deposited over the third-layer wiring 43. The barrier insulating film 44 is an insulating film for preventing the diffusion of Cu and composed of a SiCN film having a thickness of about 50 to 100 nm deposited by plasma CVD like the underlying barrier insulating films 34 and 21. A fourth-layer wiring to be formed in the inter-layer insulating film 45 in the subsequent step is larger in size, distance between wirings and thickness than the wirings of lower layers. The inter-layer insulating film 45 is therefore composed of a silicon oxide film having a thickness of 1 ◻m deposited by CVD. A SiCO film may be formed between the barrier insulating film 44 and the inter-layer insulating film 45 to improve adhesion between them. As a silicon oxide material constituting the inter-layer insulating film 45, silicon oxide whose dielectric constant is reduced by adding F may be used.

If the thickness of the inter-layer insulating film 45 becomes large, when the inter-layer insulating film 45 is etched halfway to form a wiring groove, it is difficult to control the depth of the wiring groove very accurately. That is, as wiring grooves 52 and 53 are deeper than the above-described wiring grooves 32 and 42, it is difficult to form these by time-controlled etching unlike the above wiring grooves 32 and 42. Then, the depth of the wiring grooves is controlled by forming a stopper film 46 having a different etching selection ratio from that of the inter-layer insulating film 45 at a halfway position of the inter-layer insulating film 45 to stop etching at the surface of the stopper film 46. In this embodiment, a SiCN film having a thickness of about 10 to 100 nm deposited by plasma CVD is used as the stopper film 46 formed at a halfway position of the inter-layer insulating film 45. Since the SiCN film has a high etching selection ratio for a silicon oxide film and a low dielectric constant, it is useful as the stopper film 46. Further, as it has low reflectance (smaller refractive index than that of the inter-layer insulating film 45), it also serves as an anti-reflection film as will be described hereinafter.

Figure 16:
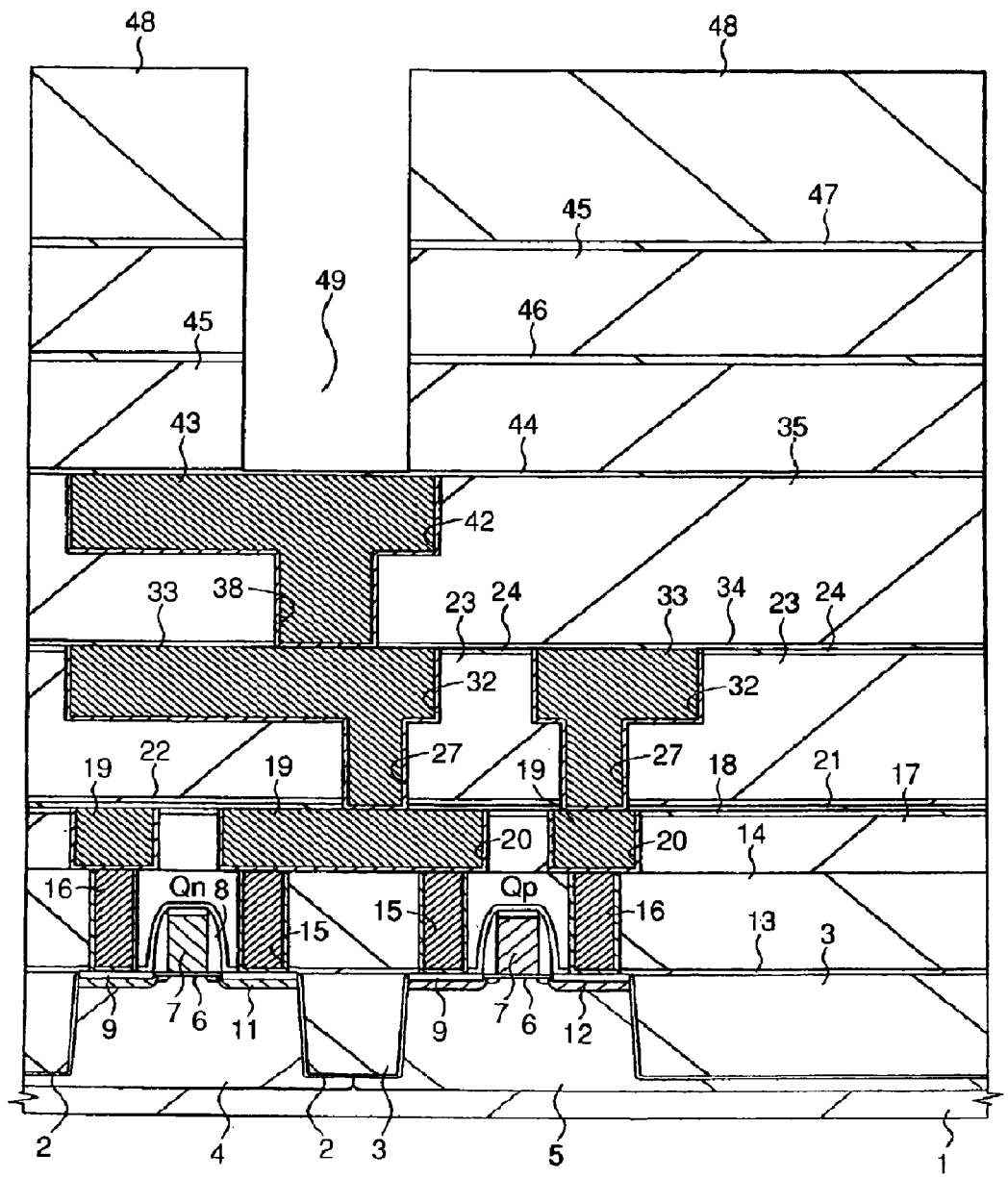
FIG. 16 is a sectional view of the key section of the semiconductor substrate showing the method of manufacturing a semiconductor device after FIG. 15.

After an anti-reflection film 47 is formed over the inter-layer insulating film 45 as shown in FIG. 16, a via hole 49 is formed above the third-layer wiring 43 by dry etching the anti-reflection film 47, the inter-layer insulating film 45, the stopper film 46 and the inter-layer insulating film 45 sequentially by using a photoresist film 48 formed over the anti-reflection film 47 as a mask.

Figure 17:
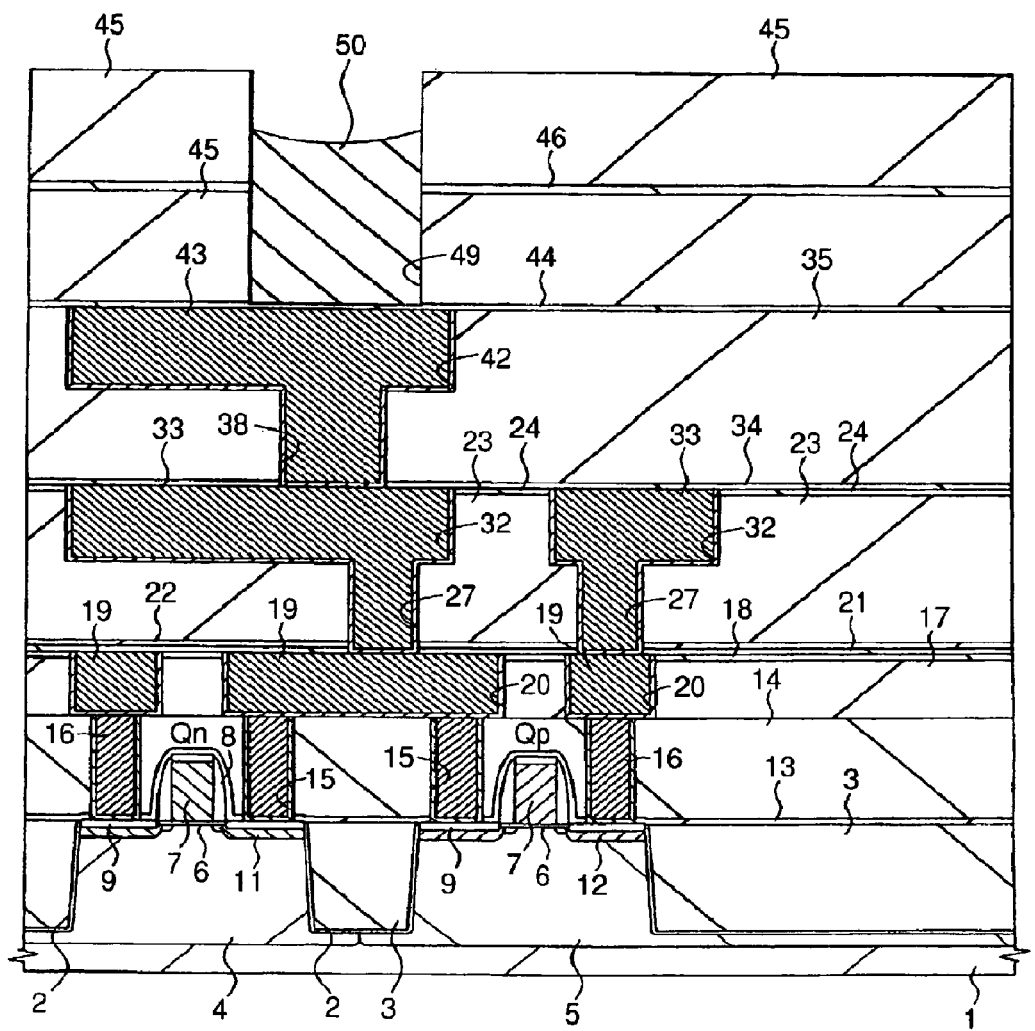
FIG. 17 is a sectional view of the key section of the semiconductor substrate showing the method of manufacturing a semiconductor device after FIG. 16.

After the photoresist film 48 and the anti-reflection film 47 are removed, as shown in FIG. 17, the filling agent 50 is filled into the inside of the via hole 49. The material of the filling agent 50 and the method of filling the filling agent 50 are the same as described above. Since the via hole 49 for forming a fourth-layer wiring is larger in diameter and depth than the via holes 38 and 27 of lower layers, it is difficult to fill the filling agent 50 well. Therefore, the surface of the filling agent 50 filled into the via hole 49 does not become flat and there is a level difference between it and the surface of the inter-layer insulating film 45.

Figure 18:
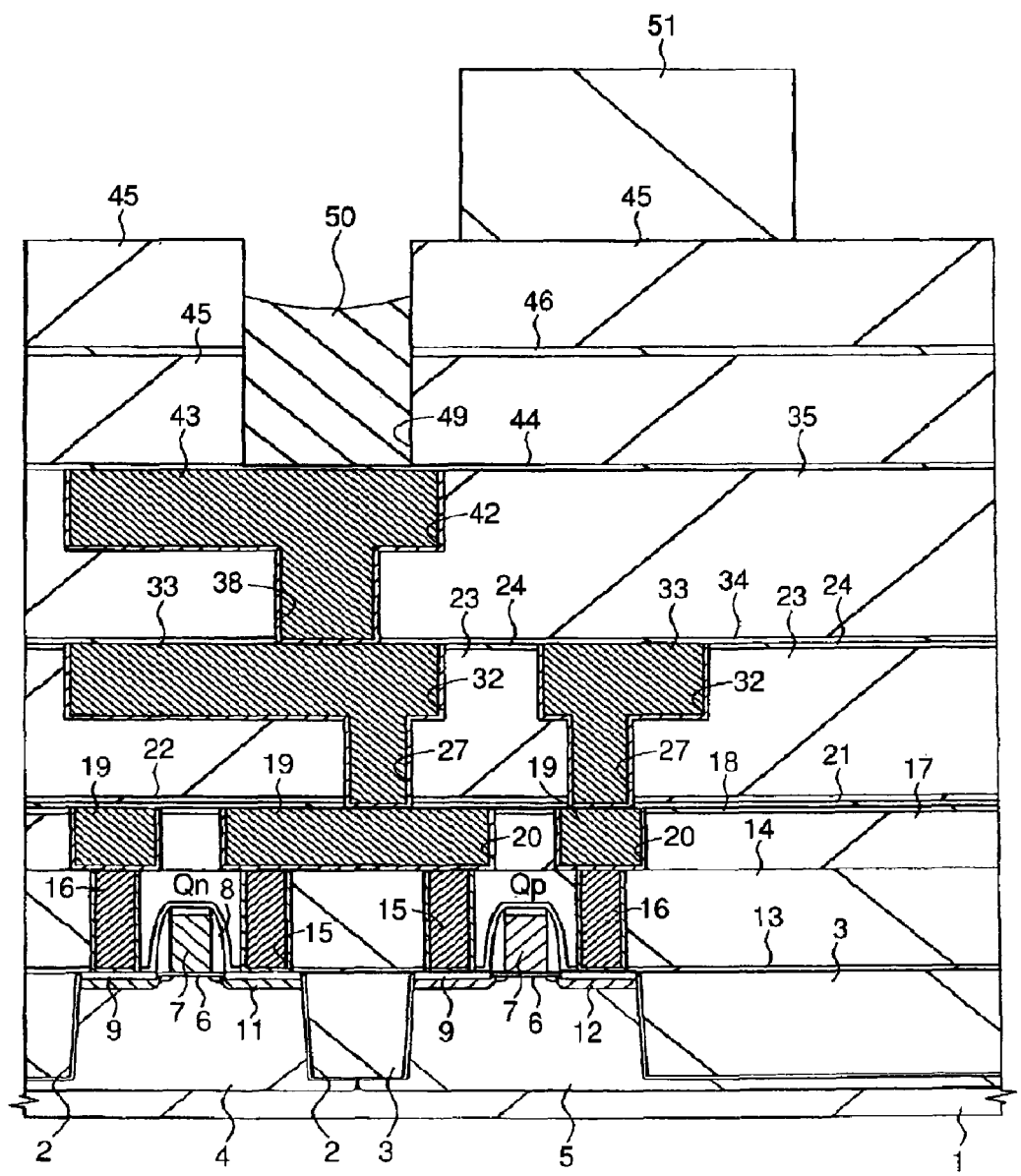
FIG. 18 is a sectional view of the key section of the semiconductor substrate showing the method of manufacturing a semiconductor device after FIG. 17.

Then, as shown in FIG. 18, a photoresist film 51 is formed over the inter-layer insulating film 45. Since the surface of the filling agent 50 filled into the via hole 49 is not flat and there is a level different between it and the surface of the inter-layer insulating film 45 as described above, it is difficult to form a uniform anti-reflection film over the entire surface of the inter-layer insulating film 45 by coating. Therefore, a photoresist film 51 is directly formed on the inter-layer insulating film 45 without using the anti-reflection film.

The photoresist film 51 is exposed by using a photomask (not shown) having a wiring groove pattern and a fuse pattern and developed to transfer a pattern having openings for wiring groove forming areas and fuse forming areas. The stopper film 46 composed of a SiCN film having a low reflectance is formed at a halfway position of the inter-layer insulating film 45 as described above. Therefore, it is possible to suppress inconvenience that resolution is reduced by the incidence upon the photoresist film 51 of exposure light reflected on the surface of the third-layer wiring 43 without forming an anti-reflection film under the photoresist film 51. Thereby, the step of forming an anti-reflection film under the photoresist film 51 is not required, thereby making it possible to simplify the step. The stopper film 46 formed at a halfway position of the inter-layer insulating film 45 must have a different etching selection ratio from that of the silicon oxide film, a low reflectance and a low dielectric constant. Examples of such an insulating material include silicon nitride (SiN) and silicon oxynitride (SiON) in addition to SiCN. Out of these, SiCN is the most preferred.

Figure 19:
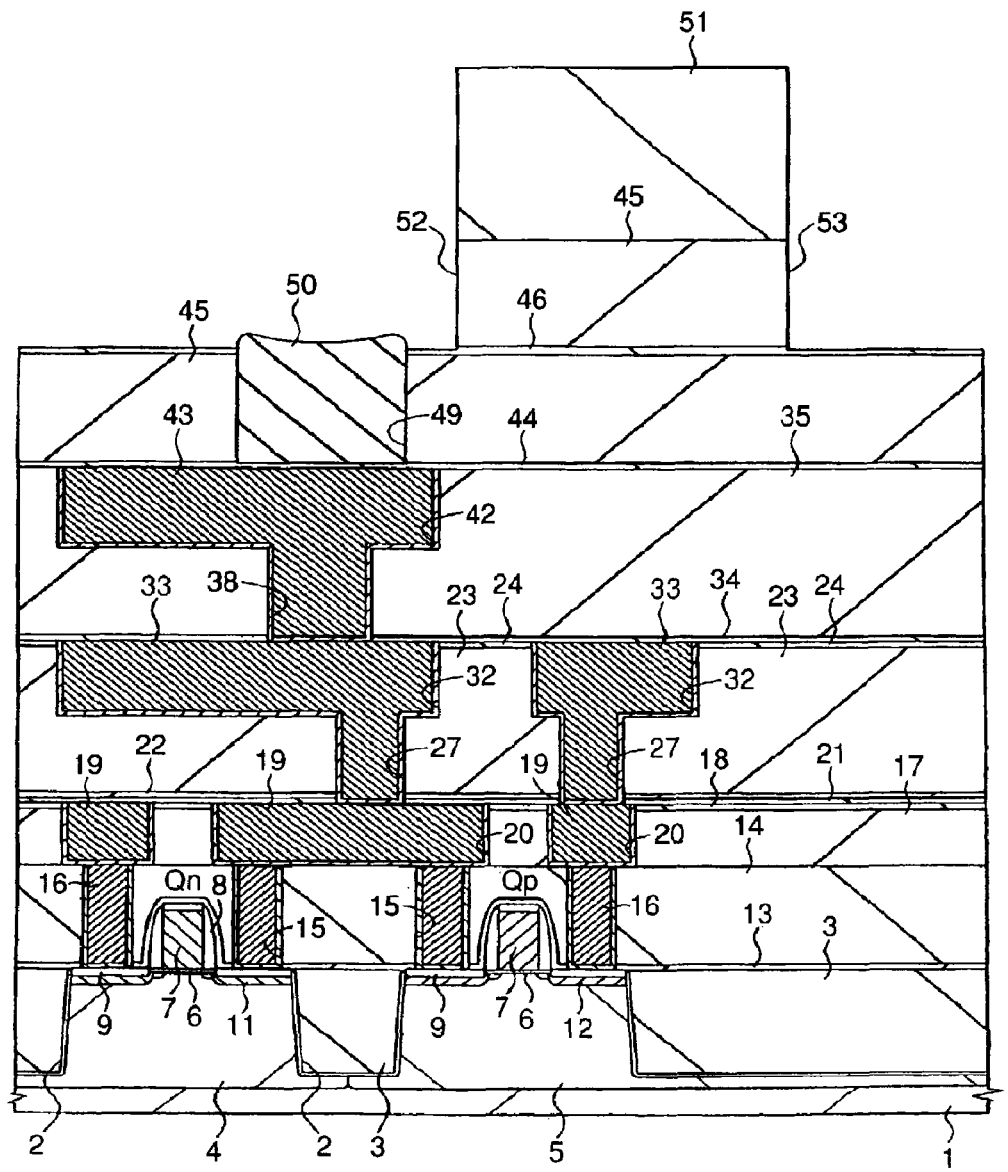
FIG. 19 is a sectional view of the key section of the semiconductor substrate showing the method of manufacturing a semiconductor device after FIG. 18.

Then, as shown in FIG. 19, the inter-layer insulating film 45 is dry etched by using the photoresist film 51 as a mask and etching is stopped at the surface of the stopper film 46. Thereby, wiring grooves 52 and 53 are formed in the inter-layer insulating film 45 over the stopper film 46.

Figure 20:
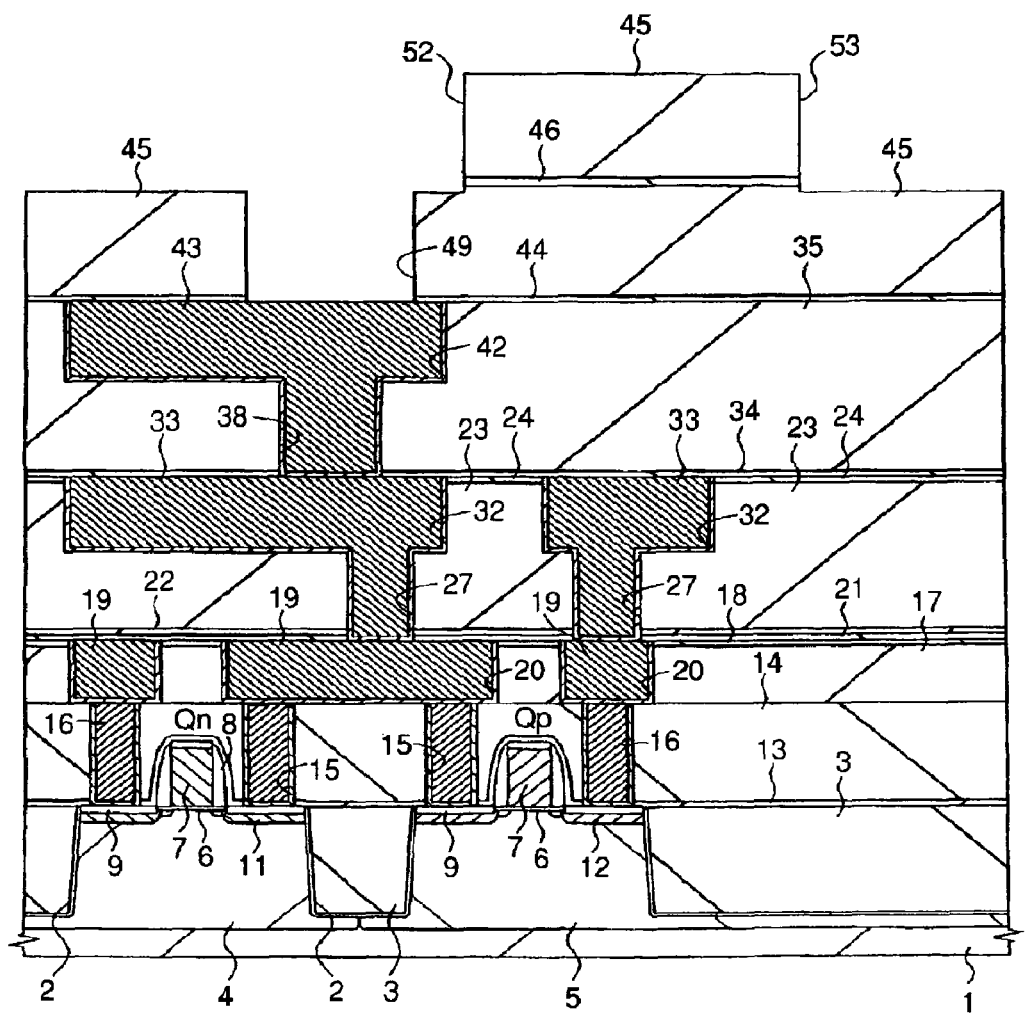
FIG. 20 is a sectional view of the key section of the semiconductor substrate showing the method of manufacturing a semiconductor device after FIG. 19.

As shown in FIG. 20, the photoresist film 51 and the filling agent 50 filled in the via hole 49 are then removed by wet etching. The surface of the third-layer wiring 43 is exposed to the bottom of the via hole 49 by removing the barrier insulating film 44 at the bottom of the via hole 49 by dry etching.

Figure 21:
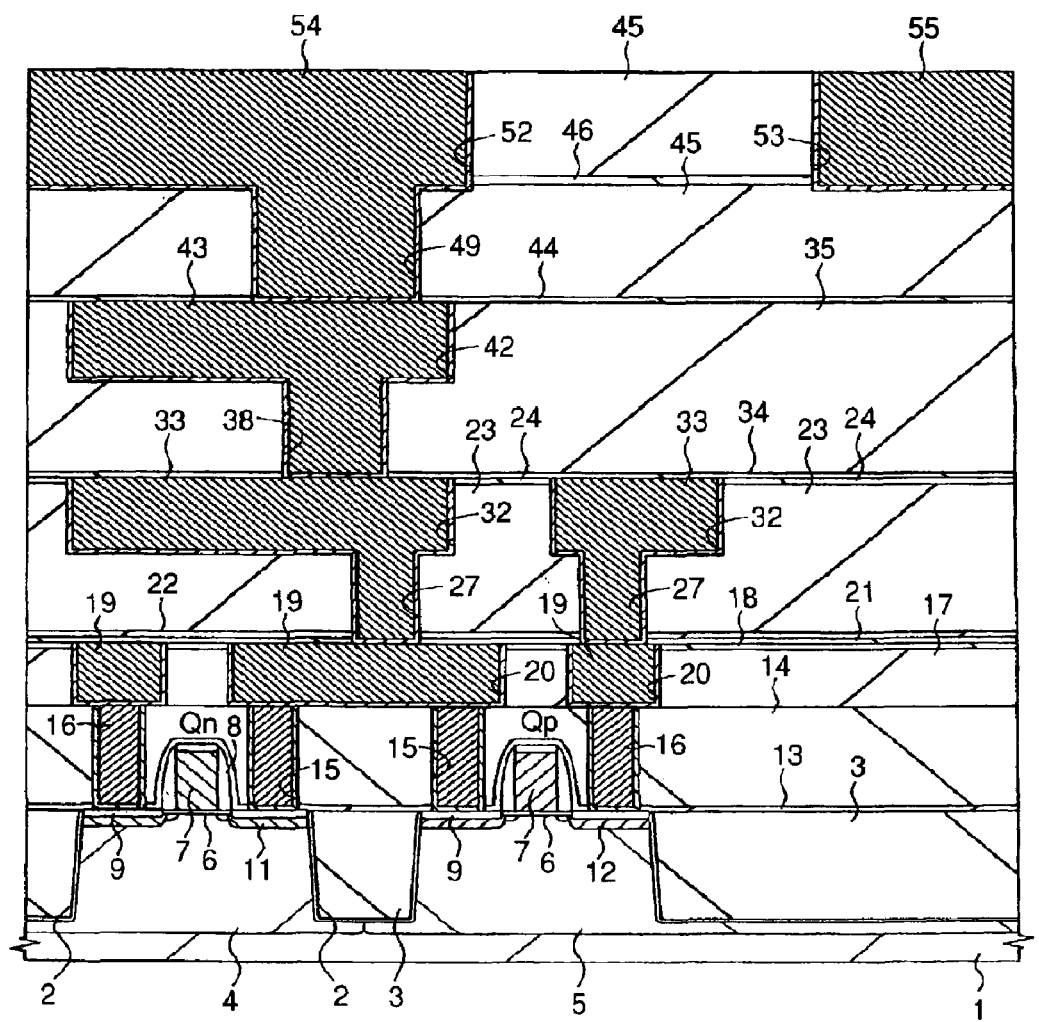
FIG. 21 is a sectional view of the key section of the semiconductor substrate showing the method of manufacturing a semiconductor device after FIG. 20.

As shown in FIG. 21, a fourth-layer wiring 54 is then formed in the insides of the wiring groove 52 and the via hole 49 and a fourth-layer wiring 54 which will become a fuse 55 is also formed in the inside of the wiring groove 53. Not shown, the fuse 55 is connected to resistor elements by the wirings of lower layers. The resistor elements are formed of a polycrystal silicon film of the same layer as the gate electrodes 7 of MISFET's (Qn, Qp). When a defect is found in part of the CMOS memory by a probe test which will be described hereinafter, a laser beam is used to cut the fuse 55 to change the resistance values of the resistor elements and replace the defective memory with a redundant memory.

To form the fourth-layer wiring 54 and the fuse 55, a thin TiN film (barrier metal film) is deposited over the inter-layer insulating film 45 including the insides of the wiring grooves 52 and 53 and the via hole 49 by sputtering, a thick Cu film is deposited over this TiN film by sputtering or plating, and the Cu film and the barrier metal film outside the wiring grooves 52 and 53 are removed by chemical mechanical polishing.

Although the etching stopper film 46 remains in the inter-layer insulating film 45, as the distance between wirings is laid out larger in the fourth wiring layer than in the first, second and third wiring layers below the fourth wiring layer and the inter-layer insulating film 45 is thick, increases in capacitance between wirings and capacitance between wiring layers can be almost ignored.

Figure 22:
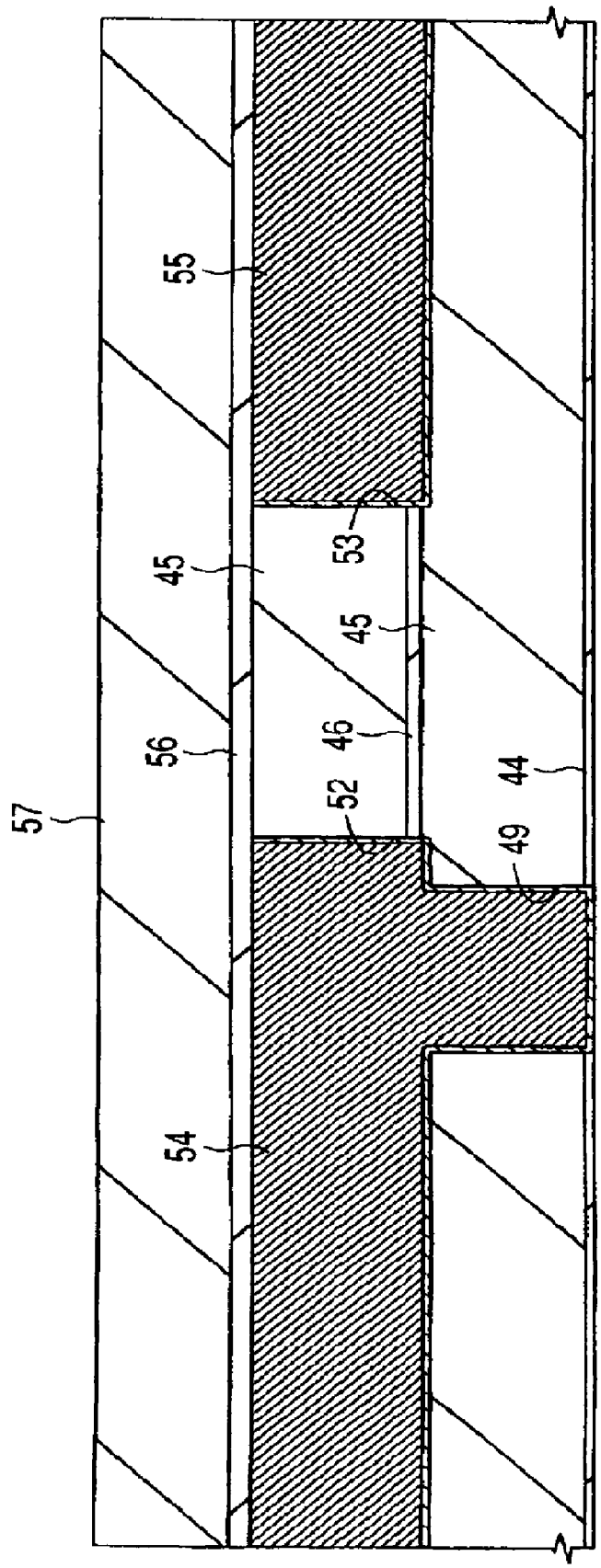
FIG. 22 is a sectional view of the key section of the semiconductor substrate showing the method of manufacturing a semiconductor device after FIG. 21.

As shown in FIG. 22, a barrier insulating film 56 and an inter-layer insulating film 57 are deposited over the fourth-layer wiring 54 and the fuse 55. The barrier insulating film 56 is an insulating film for preventing the diffusion of Cu and composed of a SiCN film deposited by plasma CVD like the underlying barrier insulating films 44, 34 and 21. The inter-layer insulating film 57 is composed of a silicon oxide-based insulating film like the underlying inter-layer insulating films 45 and 35 and has a thickness of about 900 nm. In FIG. 22 and the following figures, the section below the fourth-layer wiring 54 is not shown.

As will be described hereinafter, an inter-layer insulting film and a surface protective layer are formed over the fourth-layer wiring 54 and the fuse 55. An opening for applying a laser beam to the fuse 55 is formed in the inter-layer insulating film and the surface protective film above the fuse 55. Therefore, when water enters a circuit through this opening from the outside, the fuse 55 may be corroded. Then, in this embodiment, the thickness of the above barrier insulating film 56 is made larger than those of the underlying barrier insulating films 44, 34 and 21 (for example, about 150 to 200 nm) so as to improve the moisture resistance of the fuse 55.

Figure 23:
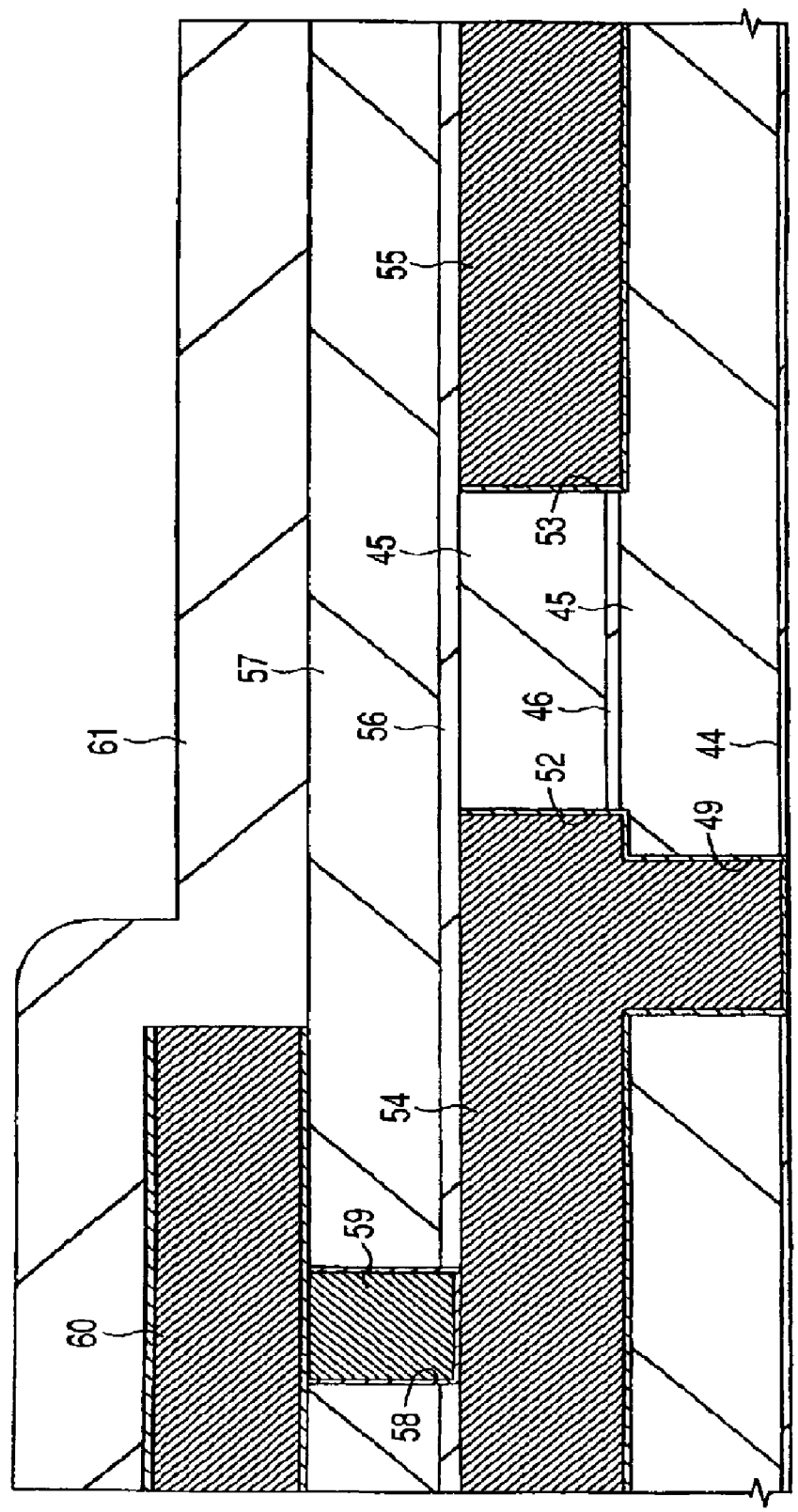
FIG. 23 is a sectional view of the key section of the semiconductor substrate showing the method of manufacturing a semiconductor device after FIG. 22.

As shown in FIG. 23, an uppermost layer wiring (fifth-layer wiring) 60 is formed over the inter-layer insulating film 57, and then a surface protective film 61 is formed over the uppermost layer wiring 60. To form the uppermost layer wiring 60, the inter-layer insulating film 57 above the fourth-layer wiring 54 is dry etched by using a photoresist film (not shown) as a mask, and the underlying barrier insulating film 56 is dry etched to form a through hole 58, and a plug 59 is formed in the inside of the through hole 58. The plug 59 is composed of a laminate consisting of a TiN film and a W film like the underlying plug 16. A TiN film having a thickness of about 50 to 100 nm, an Al alloy film having a thickness of about 1 ◾m, and a TiN film having a thickness of about 50 to 100 nm are deposited above the inter-layer insulating film 57 by sputtering, and these conductive films are etched by using a photoresist film (not shown) as a mask to form the uppermost layer wiring 60. The surface protective film 61 above the uppermost layer wiring 60 is composed of a laminate consisting of a silicon oxide film having a thickness of about 200 nm and a silicon nitride film having a thickness of about 600 nm deposited by plasma CVD.

Figure 24:
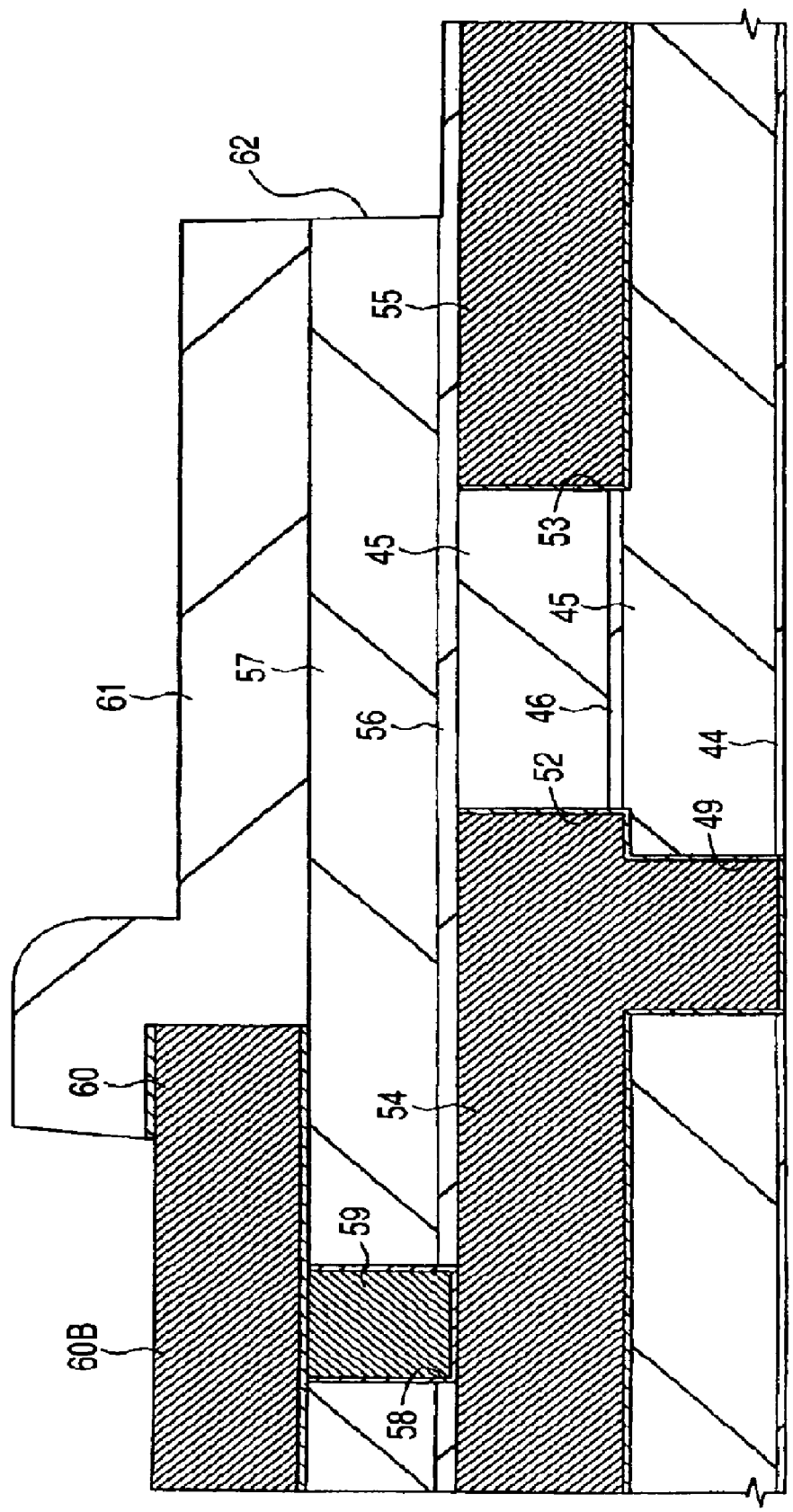
FIG. 24 is a sectional view of the key section of the semiconductor substrate showing the method of manufacturing a semiconductor device after FIG. 23.

As shown in FIG. 24, the surface protective film 61 is then dry etched by using a photoresist film (not shown) as a mask to expose part of the uppermost layer wiring 60 so as to form a bonding pad 60B. The surface protective film 61 and the inter-layer insulating film 57 above the fuse 55 are dry etched to form an opening 62. Etching is stopped at the surface of the barrier insulating film 56 covering the fuse 55 so that the barrier insulating film 56 remains over the fuse 55.

Since the barrier insulating film 56 over the fuse 55 is made thicker than the underlying barrier insulating films 44, 34 and 21, moisture resistance can be ensured. That is, if the thickness of the above barrier insulating film 56 is equal to the thicknesses of the underlying barrier insulating films 44, 34 and 21, the thickness of the barrier insulating film 56 becomes smaller by the etching step for forming the opening 62 above the fuse 55, the oxygen plasma ashing step for removing the photoresist film and other cleaning step, thereby reducing moisture resistance. Since etching for forming the opening 62 in particular must be made deeper than the underlying inter-layer insulating films, a loss of the barrier insulating film 56 by over-etching is apprehended. Therefore, the thickness of the barrier insulating film 56 must be made larger than the thicknesses of the underlying barrier insulating films 44, 34 and 21 in this embodiment.

A circuit electric test is then carried out by applying a probe (not shown) to the surface of the bonding pad 60B (probe test). When a defect is found in part of a semiconductor device by this probe test, a laser beam is applied to the fuse 55 through the opening 62 to cut it so as to replace the defective memory with a redundant memory.

The insulating film to be left on the fuse 55 must be thick enough to be cut by the application of a laser beam and the insulating film 57 may be left as required.

Figure 25:
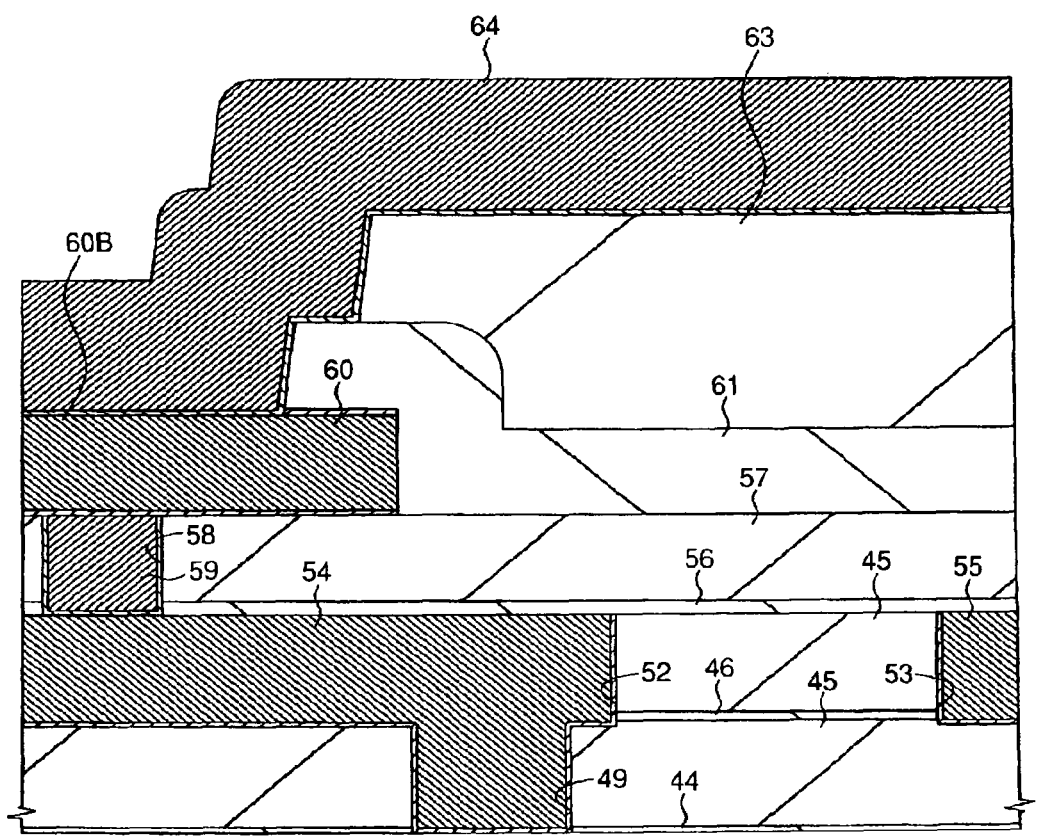
FIG. 25 is a sectional view of the key section of the semiconductor substrate showing the method of manufacturing a semiconductor device after FIG. 24.

After a polyimide resin film 63 is deposited over the surface protective film 61 as shown in FIG. 25, a leader line 64 is formed over the polyimide resin film 63 to be electrically connected to the bonding pad 60B. This leader line 64 is used to electrically connect a solder bump constituting the external connection terminal of a CMOS memory to the bonding pad 60B. To form the leader line 64, the polyimide resin film 63 is first deposited over the surface protective film 61, and the polyimide resin film 63 above the bonding pad 60B is etched by using a photoresist film (not shown) as a mask to expose the surface of the bonding pad 60B. After a photoresist film (not shown) where the area for forming the leader line 64 is open is formed over the surface protective film 61, a Cu film is formed over the surface protective film 61 by plating or sputtering.

Figure 26:
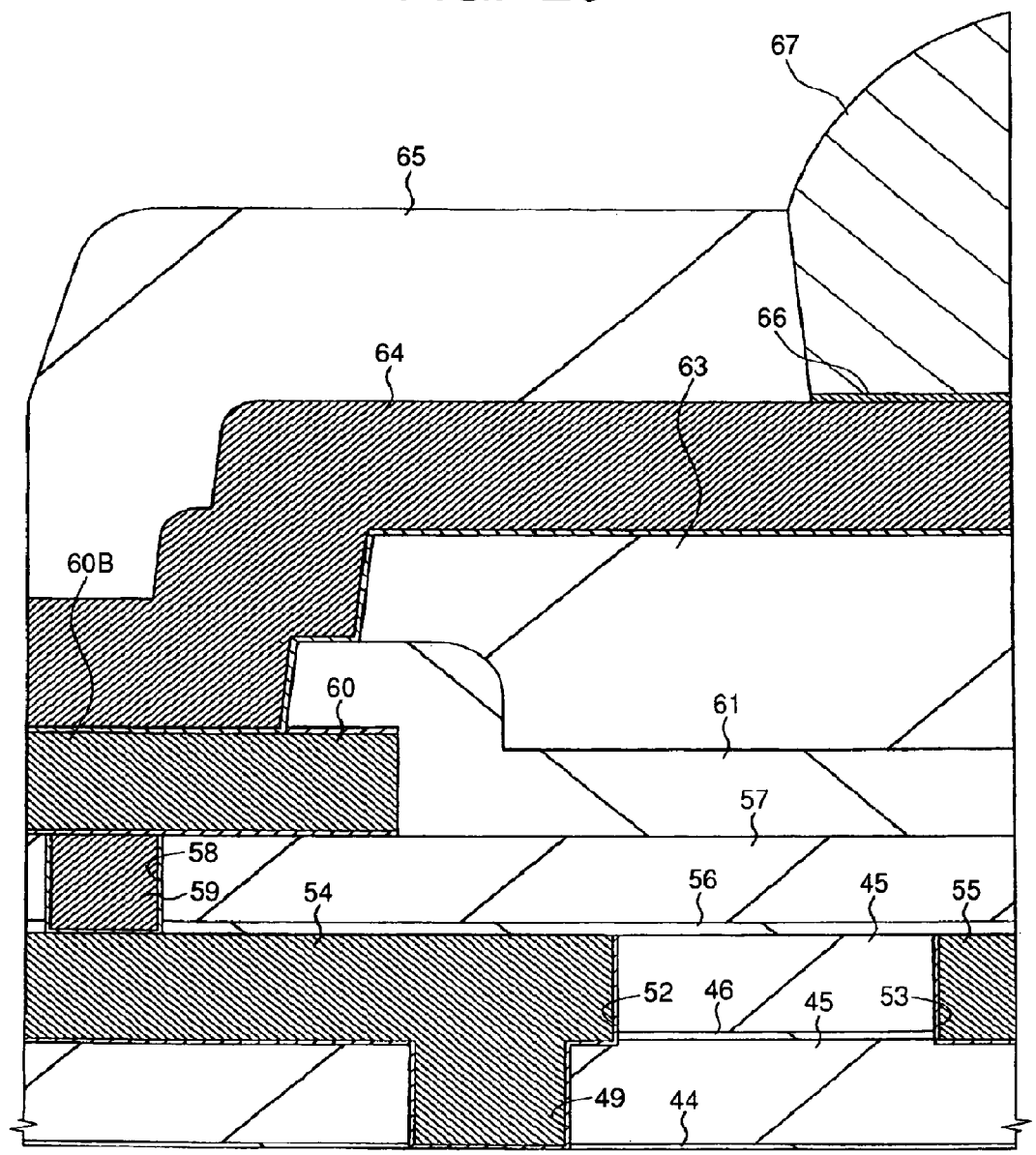
FIG. 26 is a sectional view of the key section of the semiconductor substrate showing the method of manufacturing a semiconductor device after FIG. 25.

After the surface of the leader line 64 composed of a Cu film is covered with a polyimide resin film 65 as shown in FIG. 26, part of the polyimide resin film 65 is etched to expose one end portion of the leader line 64 and an Au (gold) film 66 is formed on the surface of the leader line 64 by plating. Thereafter, a solder bump 67 is formed on the surface of the Au (gold) film 66 by printing to form an external connection terminal for the semiconductor device.

Although the barrier insulating film 56 above the fuse 55 becomes thin by etching or the ashing of the photoresist film in the above step of forming the leader line 64, the deterioration of moisture resistance can be prevented by making the barrier insulating film 56 thick in advance.

(Embodiment 2)

In the above Embodiment 1, the wiring groove is formed after the via hole is formed in the inter-layer insulating film. In this embodiment, after the wiring groove is formed in the inter-layer insulating film, the via hole is formed.

Figure 27:
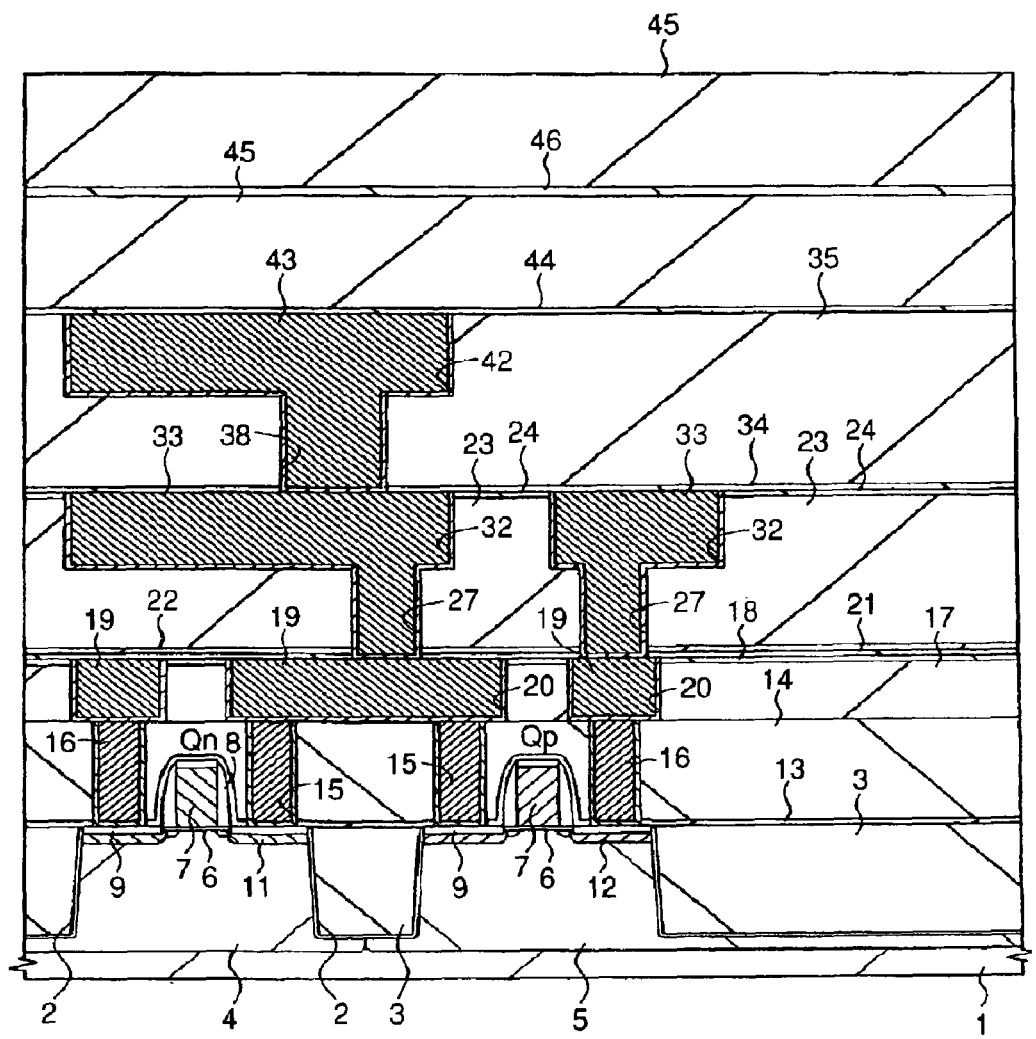
FIG. 27 is a sectional view of the key section of a semiconductor substrate showing a method of manufacturing a semiconductor device according to another embodiment of the present invention.

First, as shown in FIG. 27, the barrier insulating film 44 and the inter-layer insulating film 45 are deposited over the third-layer wiring 43. The stopper film 46 is formed at a halfway position of the inter-layer insulating film 45. A SiCN film having a thickness of about 10 to 100 nm deposited by plasma CVD is used as the stopper film 46. The steps so far are identical to those shown in FIGS. 1 to 15 of the above embodiment.

Figure 28:
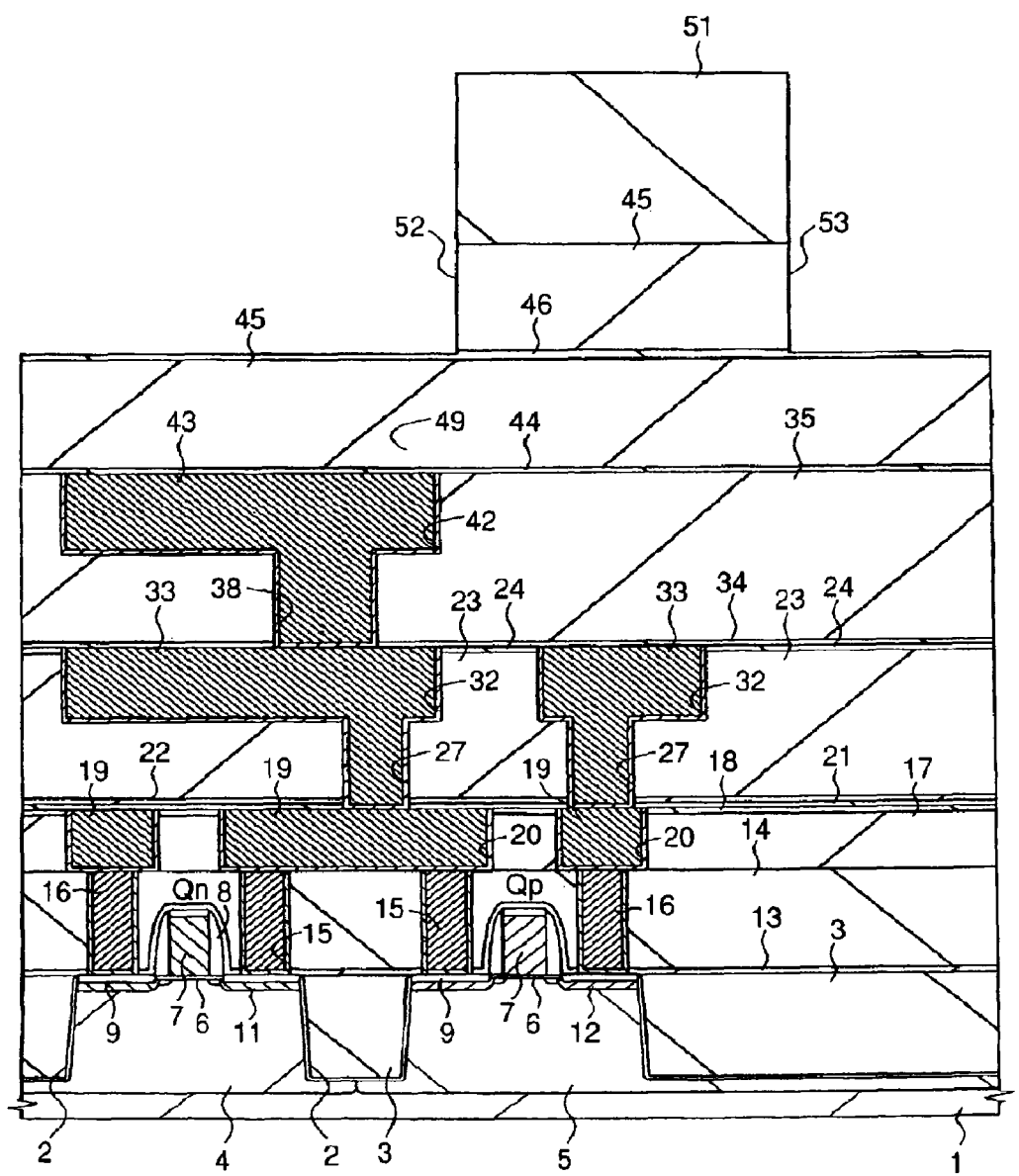
FIG. 28 is a sectional view of the key section of the semiconductor substrate showing the method of manufacturing a semiconductor device after FIG. 27.

After the photoresist film 51 is formed over the inter-layer insulating film 45 as shown in FIG. 28, the inter-layer insulating film 45 is dry etched by using the photoresist film 51 as a mask, and etching is stopped at the surface of the stopper film 46 to form wiring grooves 52 and 53 in the inter-layer insulating film above the stopper film 46. Although an anti-reflection film is not formed between the inter-layer insulating film 45 and the photoresist film 51 in this embodiment, the stopper film 46 composed of a SiCN film having a low reflectance is formed at a halfway position of the inter-layer insulating film 45. Therefore, inconvenience that resolution is reduced by the incidence upon the photoresist film 51 of exposure light reflected on the surface of the third-layer wiring 43 can be suppressed without forming the anti-reflection film below the photoresist film 51.

Figure 29:
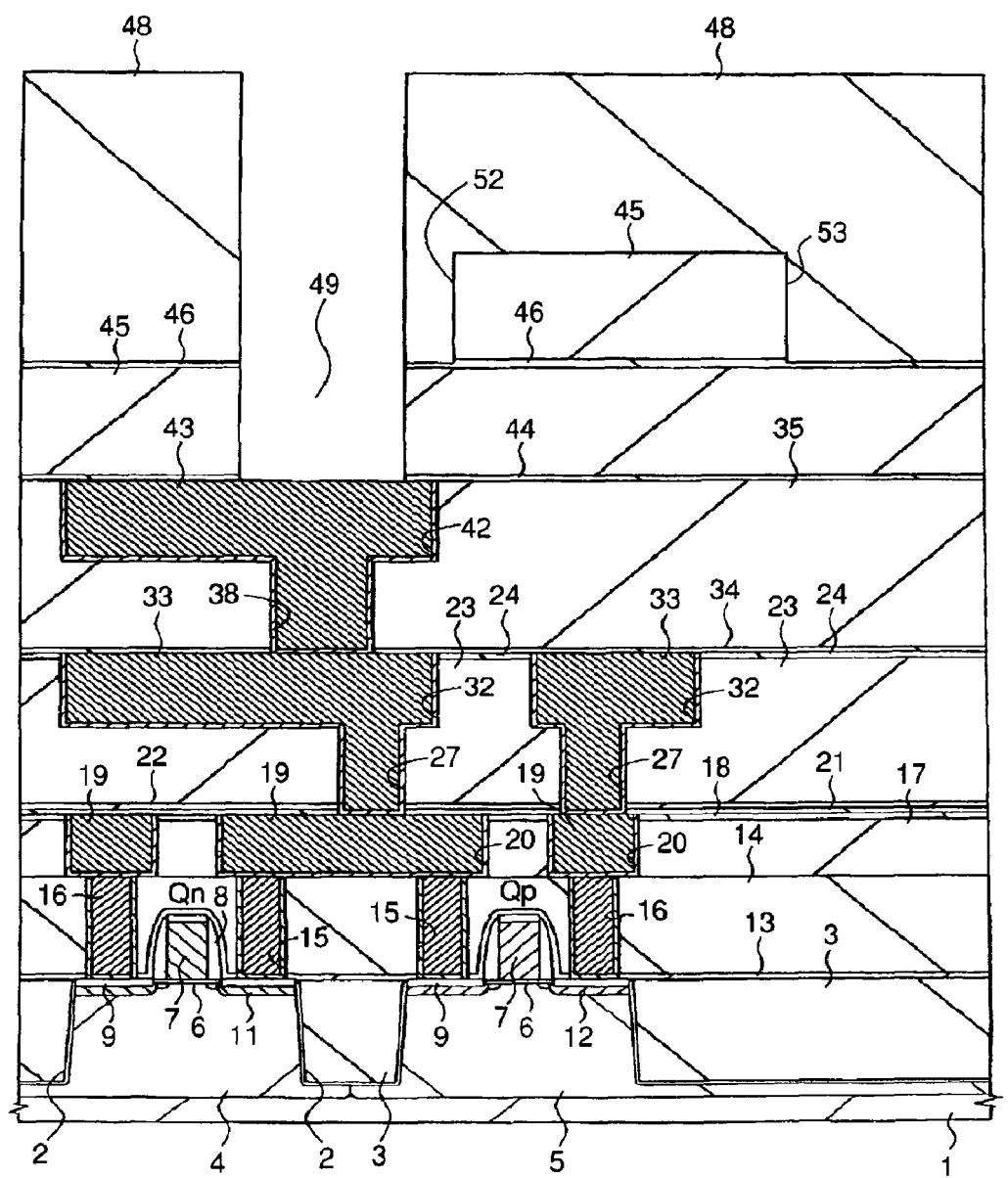
FIG. 29 is a sectional view of the key section of the semiconductor substrate showing the method of manufacturing a semiconductor device after FIG. 28.

After the photoresist film 48 is formed over the inter-layer insulating film 45 as shown in FIG. 29, the inter-layer insulating film 45 and the barrier insulating film 46 are dry etched by using the photoresist film 48 as a mask to form a via hole 49 so as to expose the third-layer wiring 43 to the bottom of the via hole 49. Since the stopper film 48 also serves as an anti-reflection film in this case, inconvenience that resolution is reduced by the incidence upon the photoresist film 48 of exposure light reflected on the surface of the third-layer wiring 43 can be suppressed.

Figure 30:
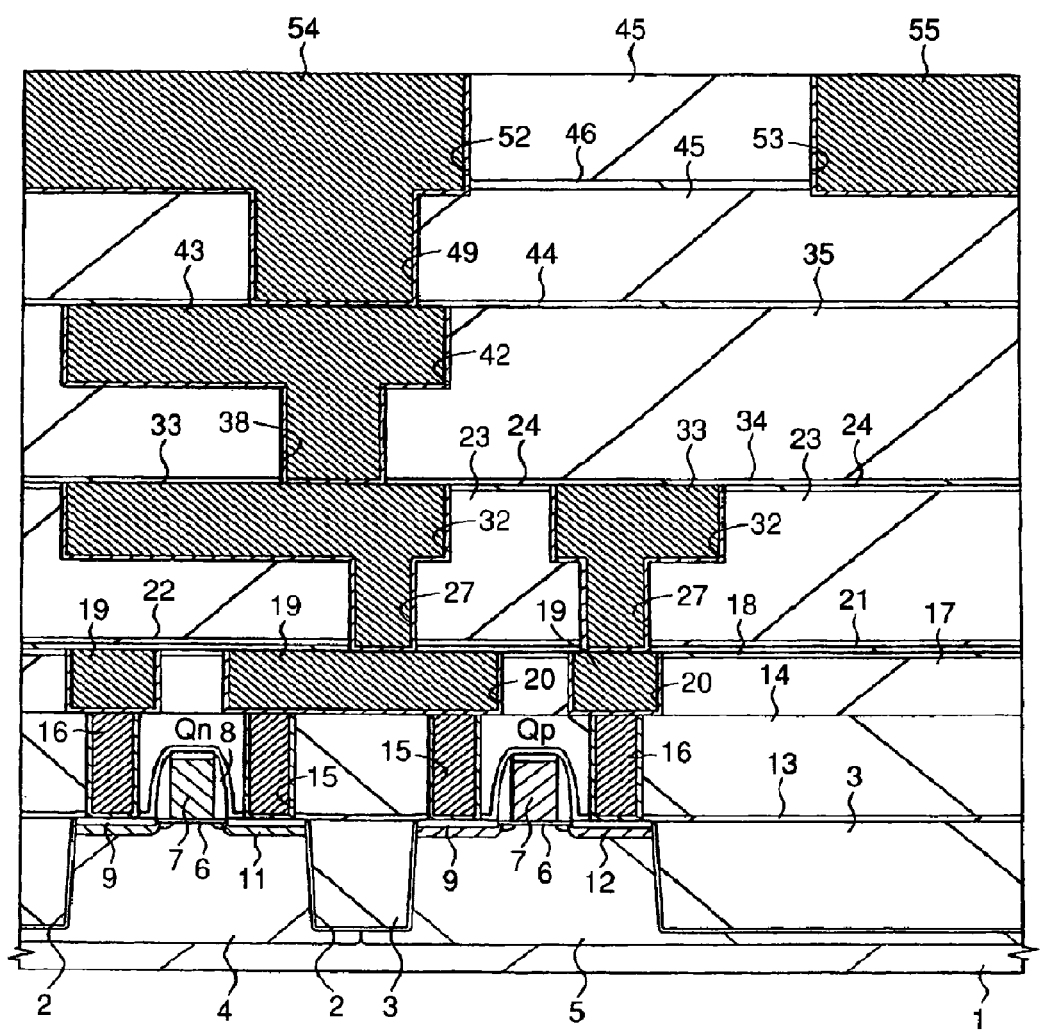
FIG. 30 is a sectional view of the key section of the semiconductor substrate showing the method of manufacturing a semiconductor device after FIG. 29.

After the photoresist film 48 is removed, as shown in FIG. 30, the fourth-layer wiring 54 is formed in the insides of the wiring groove 52 and the via hole 49, and the fuse 55 is formed in the inside of the wiring groove 53. The fourth-layer wiring 54 and the fuse 55 are formed in the same manner as in the above Embodiment 1.

Also in this embodiment in which the via hole 49 is formed after the wiring grooves 52 and 53 are formed in the inter-layer insulating film 45, the step of forming the fourth-layer wiring 54 can be simplified. The fourth-layer wiring 54 can be formed at a high yield.

While the invention made by the inventor of the present invention has been described based on its embodiments, it is needless to say that the present invention is not limited thereto and that various changes and modification may be made in the invention without departing from the spirit and scope thereof. For example, the present invention can be applied to the method of manufacturing a semiconductor device having 5 or more Cu wiring layers.

The present invention is advantageously applied to a semiconductor device having multi-layer wirings formed by the dual Damascene technique.

What is claimed is:

1. A semiconductor device comprising:
   a first inter-layer insulating film formed over a semiconductor substrate;
   first wirings buried in first wiring grooves formed in the first inter-layer insulating film, wherein the first wirings are formed of copper as a main component;
   a first barrier insulating film formed directly on the first wirings and the first inter-layer insulating film, wherein the first barrier insulating film has a function for preventing the diffusion of copper;
   a second inter-layer insulating film formed over the first barrier insulating film;
   a fuse buried in a second wiring groove formed in the second inter-layer insulating film, wherein the fuse is formed of copper as a main component;
   a second wiring having a via buried in a third wiring groove and a via hole formed in the second inter-layer insulating film, wherein the second wiring is formed of copper as a main component;
   a second barrier insulating film formed directly on the fuse, the second wiring and the second inter-layer insulating film, wherein the second barrier insulating film has a function for preventing the diffusion of copper; and
   a third inter-layer insulating film formed over the second barrier insulating film,
   wherein a thickness of the second barrier insulating film is larger than a thickness of the first barrier insulating film,
   wherein an opening reaching the second barrier insulating film is formed in the third inter-layer insulating film above the fuse, and
   wherein the via directly contacts the first wiring.

2. The semiconductor device according to claim 1,
   wherein the first barrier insulating film includes a SiCN film and the second barrier insulating film includes a SiCN film.

3. A semiconductor device comprising:
   a first inter-layer insulating film formed over a semiconductor substrate;
   first wirings buried in first wiring grooves formed in the first inter-layer insulating film, wherein the first wirings are formed of copper as a main component;
   a first barrier insulating film formed directly on the first wirings and the first inter-layer insulating film, wherein the first barrier insulating film has a function for preventing the diffusion of copper;
   a second inter-layer insulating film formed directly on the first barrier insulating film;
   a fuse buried in a second wiring groove formed in the second inter-layer insulating film, wherein the fuse is formed of copper as a main component;
   a second wiring buried in a third wiring groove formed in the second inter-layer insulating film, wherein the second wiring is formed of copper as a main component;

a second barrier insulating film formed directly on the fuse, the second wiring and the second inter-layer insulating film, wherein the second barrier insulating film has a function for preventing the diffusion of copper; and a third inter-layer insulating film formed over the second barrier insulating film, wherein a thickness of the second barrier insulating film is larger than a thickness of the first barrier insulating film, and wherein an opening reaching the second barrier insulating film is formed in the third inter-layer insulating film above the fuse.

4. The semiconductor device according to claim 3, wherein the first barrier insulating film includes a SiCN film and the second insulating film includes a SiCN film.

* * * * *